US008994091B2

(12) United States Patent
Lee et al.

(10) Patent No.: US 8,994,091 B2
(45) Date of Patent: Mar. 31, 2015

(54) NON-VOLATILE MEMORY DEVICE HAVING A VERTICAL STRUCTURE AND METHOD OF FABRICATING THE SAME

(75) Inventors: Sang-Hoon Lee, Seongnam-si (KR);
Jin-Gyun Kim, Yongin-si (KR);
Koong-Hyun Nam, Anyang-si (KR);
Ki-Hyun Hwang, Seongnam-si (KR);
Hun-Hyeong Lim, Hwaseong-si (KR);
Dong-Kyum Kim, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 106 days.

(21) Appl. No.: 13/458,293

(22) Filed: Apr. 27, 2012

(65) Prior Publication Data

US 2012/0280304 A1 Nov. 8, 2012

(30) Foreign Application Priority Data

May 3, 2011 (KR) ........................ 10-2011-0041995

(51) Int. Cl.
*H01L 29/76* (2006.01)
*H01L 27/115* (2006.01)
*H01L 29/788* (2006.01)
*H01L 29/792* (2006.01)

(52) U.S. Cl.
CPC .... *H01L 27/11556* (2013.01); *H01L 27/11582* (2013.01); *H01L 29/7889* (2013.01); *H01L 29/7926* (2013.01)
USPC ............................ 257/316; 257/324; 438/261

(58) Field of Classification Search
CPC ..................... H01L 29/7926; H01L 27/11578; H01L 27/11582; H01L 27/11556; H01L 29/792; H01L 27/11551; H01L 21/8221; G11C 16/0483

USPC ................. 438/589, 261; 257/E21.613, 316, 257/E29.3, E21.422
See application file for complete search history.

(56) References Cited

U.S. PATENT DOCUMENTS

| 7,983,084 B2* | 7/2011 | Tokiwa et al. ............ 365/185.11 |
| 8,063,438 B2* | 11/2011 | Son et al. ...................... 257/328 |
| 8,084,805 B2* | 12/2011 | Shim et al. .................... 257/314 |
| 8,163,617 B2* | 4/2012 | Ahn ............................... 438/259 |
| 8,409,977 B2* | 4/2013 | Shim et al. .................... 438/589 |
| 2010/0097859 A1* | 4/2010 | Shim et al. ............... 365/185.05 |
| 2011/0065270 A1* | 3/2011 | Shim et al. .................... 438/589 |

FOREIGN PATENT DOCUMENTS

| JP | 2009-135328 | 6/2009 |
| JP | 2009-224466 | 10/2009 |
| JP | 2010-034112 | 2/2010 |

* cited by examiner

*Primary Examiner* — Bradley K Smith
*Assistant Examiner* — David Goodwin
(74) *Attorney, Agent, or Firm* — F. Chau & Associates, LLC

(57) ABSTRACT

A non-volatile memory device having a vertical structure includes a semiconductor layer, a sidewall insulation layer extending in a vertical direction on the semiconductor layer, and having one or more protrusion regions, first control gate electrodes arranged in the vertical direction on the semiconductor layer, and respectively contacting one of portions of the sidewall insulation layer where the one or more protrusion regions are not formed and second control gate electrodes arranged in the vertical direction on the semiconductor layer, and respectively contacting one of the one or more protrusion regions.

19 Claims, 26 Drawing Sheets ately stack-## NON-VOLATILE MEMORY DEVICE HAVING A VERTICAL STRUCTURE AND METHOD OF FABRICATING THE SAME

CROSS-REFERENCE TO RELATED APPLICATIONS

This application claims priority to Korean Patent Application No. 10-2011-0041995, filed on May 3, 2011, the disclosure of which is hereby incorporated by reference herein in its entirety.

BACKGROUND

Exemplary embodiments of the inventive concept relate to a non-volatile memory device, and more particularly, to a non-volatile memory device having a vertical structure and a method of fabricating the same.

Although electronic devices have become more and more reduced in size, they are nevertheless still required to process a large amount of data. Thus, the integration density of semiconductor memory devices for use in such electronic devices may in turn need to be increased. Consequently, non-volatile memory devices having a vertical structure are being considered instead of those devices having a conventional flat structure for increasing the integration density of the semiconductor memory devices.

SUMMARY

According to an exemplary embodiment of the inventive concept, a non-volatile memory device having a vertical structure is provided. The non-volatile memory device includes a semiconductor layer, a sidewall insulation layer extending in a vertical direction on the semiconductor layer, and having one or more protrusion regions, first control gate electrodes arranged in the vertical direction on the semiconductor layer, and respectively contacting one of portions of the sidewall insulation layer where the one or more protrusion regions are not formed and second control gate electrodes arranged in the vertical direction on the semiconductor layer, and respectively contacting one of the one or more protrusion regions.

In an exemplary embodiment of the inventive concept, widths of the second control gate electrodes may be narrower than widths of the first control gate electrodes.

In an exemplary embodiment of the inventive concept, widths of the second control gate electrodes may be the same as each other.

In an exemplary embodiment of the inventive concept, widths of the second control gate electrodes may be different from each other.

In an exemplary embodiment of the inventive concept, a width of at least one second control gate electrode located relatively close to the semiconductor layer may be narrower than a width of at least one second control gate electrode located relatively far from the semiconductor layer.

In an exemplary embodiment of the inventive concept, a width of at least one second control gate electrode located relatively close to the semiconductor layer may be wider than a width of at least one second control gate electrode located relatively far from the semiconductor layer.

In an exemplary embodiment of the inventive concept, the second control gate electrodes may be located relatively close to the semiconductor layer, compared to the first control gate electrodes.

In an exemplary embodiment of the inventive concept, the second control gate electrodes may be located relatively far from the semiconductor layer, compared to the first control gate electrodes.

In an exemplary embodiment of the inventive concept, widths of the protrusion regions may be the same as or different from each other.

In an exemplary embodiment of the inventive concept, the second control gate electrodes may constitute one of ground selection transistors or string selection transistors.

In an exemplary embodiment of the inventive concept, the first control gate electrodes adjacent to the second control gate electrodes may constitute one of ground selection transistors or string selection transistors.

In an exemplary embodiment of the inventive concept, the first control gate electrodes may constitute memory cells.

According to an exemplary embodiment of the present inventive concept, a non-volatile memory device having a vertical structure is provided. The non-volatile memory device includes a semiconductor layer, a channel region extending in a vertical direction on the semiconductor layer, control gate electrodes arranged along a sidewall of the channel region in the vertical direction on the semiconductor layer and a sidewall insulation layer located opposite to the channel region with respect to the control gate electrodes, and having one or more protrusion regions protruded toward some of the control gate electrodes.

In an exemplary embodiment of the inventive concept, the non-volatile memory device may further include a storage structure interposed between the channel region and the control gate electrodes, and the storage structure may continuously extend along the control gate electrodes.

In an exemplary embodiment of the inventive concept, the non-volatile memory device may further include a storage structure interposed between the channel region and the control gate electrodes, and the storage structure may continuously extend along the channel region.

According to an exemplary embodiment of the inventive concept, a method of fabricating a non-volatile memory device is provided. The method includes alternatively stacking a plurality of interlayer insulation layers and interlayer sacrificial layers on a semiconductor layer, forming a plurality of first opening portions to expose the semiconductor layer by removing portions of the interlayer insulation layers and the interlayer sacrificial layers, forming a plurality of channel regions covering sidewalls and a lower side of the first opening portions, and the channel regions extend in a vertical direction on the semiconductor layer, forming a filling insulating layer on the channel regions to fill each of the first opening portions, forming a plurality of second opening portions exposing the semiconductor layer by removing portions of the interlayer insulation layers and the interlayer sacrificial layers between the channel regions, forming a plurality of third opening portions connected to the second opening portions by removing the interlayer sacrificial layers interposed between the interlayer insulation layers, and sidewalls of the channel regions are exposed by the second and third opening portions, and forming a plurality of storage structures on sidewalls of the interlayer insulation layers and on the sidewalls of the channel region, which are exposed by the second opening portions and the third opening portions. The storage structures include a tunnel insulating layer, a charge storage layer and a blocking insulating layer sequentially stacked on the sidewalls of the interlayer insulating layers and on the sidewalls of the channel regions.

The method further includes forming a plurality of interlayer conductive layers on the storage structures so as to fill the second opening portions and the third opening portions, forming a plurality of fourth opening portions by removing portions of the interlayer conductive layers to expose sidewalls of the storage structures, and such that the interlayer conductive layers remain in the third opening portions and remaining portions of interlayer conductive layers cover a top side of the semiconductor layer and the sidewalls of the interlayer insulation layers located adjacent to the semiconductor layer, forming a plurality of first sacrificial spacers in an upper region of the fourth opening portions to cover sidewalls of portions of the interlayer conductive layers and sidewalls of the portions of the interlayer insulation layers which are not adjacent to the semiconductor layer, and forming a plurality of second sacrificial spacers in a lower region of the fourth opening portions to cover the remaining portions of the interlayer conductive layers formed on the semiconductor layer.

In addition, the method further includes removing the remaining portions of the conductive layers formed on the semiconductor layer and the second sacrificial spacers formed thereon to expose portions of the semiconductor layer, removing a portion of at least one of the interlayer conductive layers remaining in the third opening portions to form a first interlayer conductive layer having a recessed portion and another of the interlayer conductive layers in which a recessed portion has not been formed constitutes a second interlayer conductive layer, removing the first sacrificial spacers to expose sidewalls of the interlayer conductive layers remaining in the third opening portions, thereby increasing a width of the fourth opening portions, and forming a plurality of sidewall insulation layers in the fourth opening portions to cover the sidewalls of the interlayer insulation layers and the sidewalls of the interlayer conductive layers. The sidewall insulation layers have one or more protrusion regions protruded toward the first interlayer conductive layer having the recessed portion.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EXEMPLARY EMBODIMENTS

Figure 1:
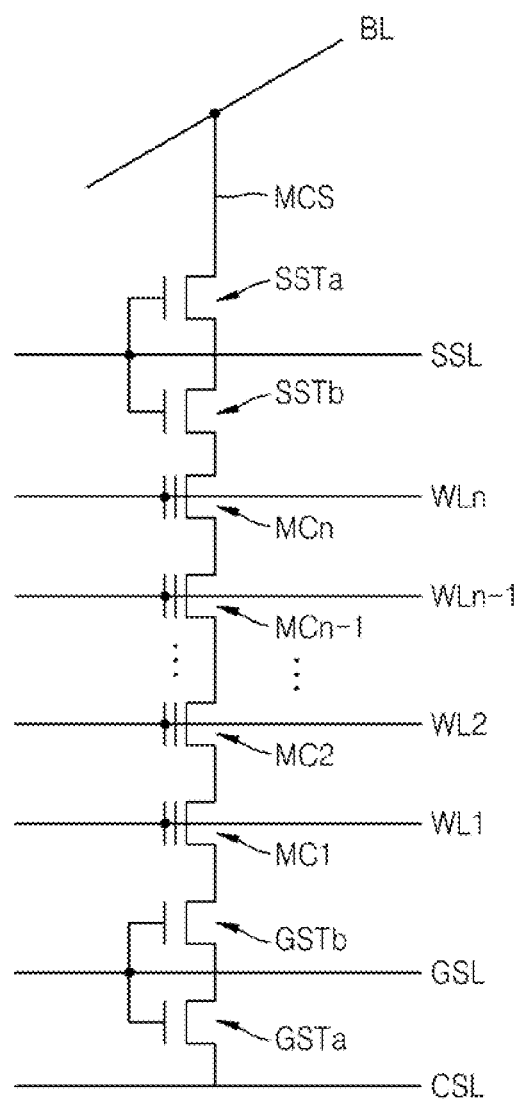
FIG. 1 is an equivalent circuit diagram of a memory cell string of a non-volatile memory device according to an exemplary embodiment of the inventive concept.

Reference will now be made in detail to exemplary embodiments, examples of which are illustrated in the accompanying drawings. However, exemplary embodiments are not limited to embodiments illustrated hereinafter. In the drawings, thicknesses of layers and regions are exaggerated for clarity.

It will be understood that when an element, such as a layer, a region, or a substrate, is referred to as being "on," "connected to," or "coupled to" another element, it may be directly on, connected to, or coupled to the other element or intervening elements may be present. Like reference numerals refer to like elements throughout. As used herein, the term "and/or" includes any and all combinations of one or more of the associated listed items.

The terminology used herein is for the purpose of describing particular embodiments only and is not intended to be limiting of exemplary embodiments. As used herein, the singular forms "a," "an," and "the" are intended to include the plural forms as well, unless the context clearly indicates otherwise.

FIG. 1 is an equivalent circuit diagram of a memory cell string of a non-volatile memory device according to an exemplary embodiment of the inventive concept.

Referring to FIG. 1, a single memory cell string MCS included in a non-volatile memory device having a vertical structure including a vertical channel structure is illustrated.

The memory cell string MCS may extend, for example, in a vertical direction, such that the memory cell string MCS may have a vertical structure. The memory cell string MCS may include, for example, first and second string selection transistors SSTa and SSTb, a plurality of memory cells MC1 through MCn, and first and second ground selection transistors GSTa and GSTb. A bit line BL may be connected to one end of the memory cell string MCS. For example, the bit line BL may be connected to one end of the first string selection transistor SSTa. A common source line CSL may be connected to the other end of the memory cell string MCS, opposing to the bit line BL. For example, the common source line CSL may be connected to one end of the first ground selection transistor GSTa.

The plurality of memory cells MC1 through MCn may store data and be arranged, for example, in series in the vertical direction. A plurality of word lines WL1 through WLn may be respectively connected to, for example, each of the plurality of memory cells MC1 through MCn to respectively control the memory cells MC1 through MCn. The total number of the memory cells MC1 through MCn may be appropriately determined according to a capacity of the non-volatile memory device.

The first and second string selection transistors SSTa and SSTb may be arranged near to one end of the memory cells MC1 through MCn. For example, the first and second string selection transistors SSTa and SSTb may be located between the bit line BL and the memory cells MC1 through MCn and may be connected in series to the memory cells MC1 through MCn. The first string selection transistor SSTa may be arranged, for example, near to the bit line BL, and the second string selection transistor SSTb may be, for example, arranged further from the bit line BL compared to the first string selection transistor SSTa. The first and second string selection transistors SSTa and SSTb may control a signal transmission between the bit line BL and the memory cells MC1 through MCn. A string selection line SSL may be, for example, commonly connected to the first and second string selection transistors SSTa and SSTb. Thus, the first and second string selection transistors SSTa and SSTb may operate together as if they were unified as one transistor.

The first and second ground selection transistors GSTa and GSTb may be, for example, located to be opposite to the first and second string selection transistors SSTa and SSTb and closely to the other end of the memory cells MC1 through MCn. For example, the first and second ground selection transistors GSTa and GSTb may be located between the common source line CSL and the memory cells MC1 through MCn and may be connected in series to the memory cells MC1 through MCn. The first ground selection transistor GSTa may be, for example, arranged near to the common source line CSL, and the second ground selection transistor GSTb may be, for example, arranged further from the common source line CSL compared to the ground string selection transistor GSTa. The first and second ground selection transistors GSTa and GSTb may control a signal transmission between the common source line CSL and the memory cells MC1 through MCn. A ground selection line GSL may be, for example, commonly connected to the first and second ground selection transistors GSTa and GSTb. Thus, the first and second ground selection transistors GSTa and GSTb may operate together as if they were unified as one transistor.

To perform a programming operation of the non-volatile memory device, 0 volts may be applied to the bit line BL, an 'ON' voltage (a turn-on voltage) may be applied to the string selection line SSL, and an 'OFF' voltage (a turn-off voltage) may be applied to the ground selection line GSL. The 'ON' voltage may be, for example, equal to or greater than a threshold voltage of the first and second string selection transistors SSTa and SSTb so as to turn on the first and second string selection transistors SSTa and SSTb, and the 'OFF' voltage may be, for example, less than a threshold voltage of the first and second ground selection transistors GSTa and GSTb so as to turn off the first and second ground selection transistors GSTa and GSTb. A program voltage may be applied to a memory cell selected from among the memory cells MC1 through MCn, and a pass voltage may be applied to the other memory cells. When the program voltage is applied to the selected memory cell, electric charges may be injected into the selected memory cell due to, for example Fowler-Nordheim (FN) tunneling. The pass voltage may be, for example, greater than a threshold voltage of the memory cells MC1 through MCn.

To perform a read operation of the non-volatile memory device, a read voltage may be applied to the bit line BL, and the 'ON' voltage may be applied to the string selection line SSL and the ground selection line GSL. A reference voltage may be applied to a memory cell selected from among the memory cells MC1 through MCn, and the pass voltage may be applied to the other memory cells.

To perform an erase operation of the non-volatile memory device, an erase voltage may be applied to bodies of the memory cells MC1 through MCn, and 0 volts may be applied to the word lines WL1 through WLn. Thus, data may be simultaneously erased from the memory cells MC1 through MCn.

Figure 2:
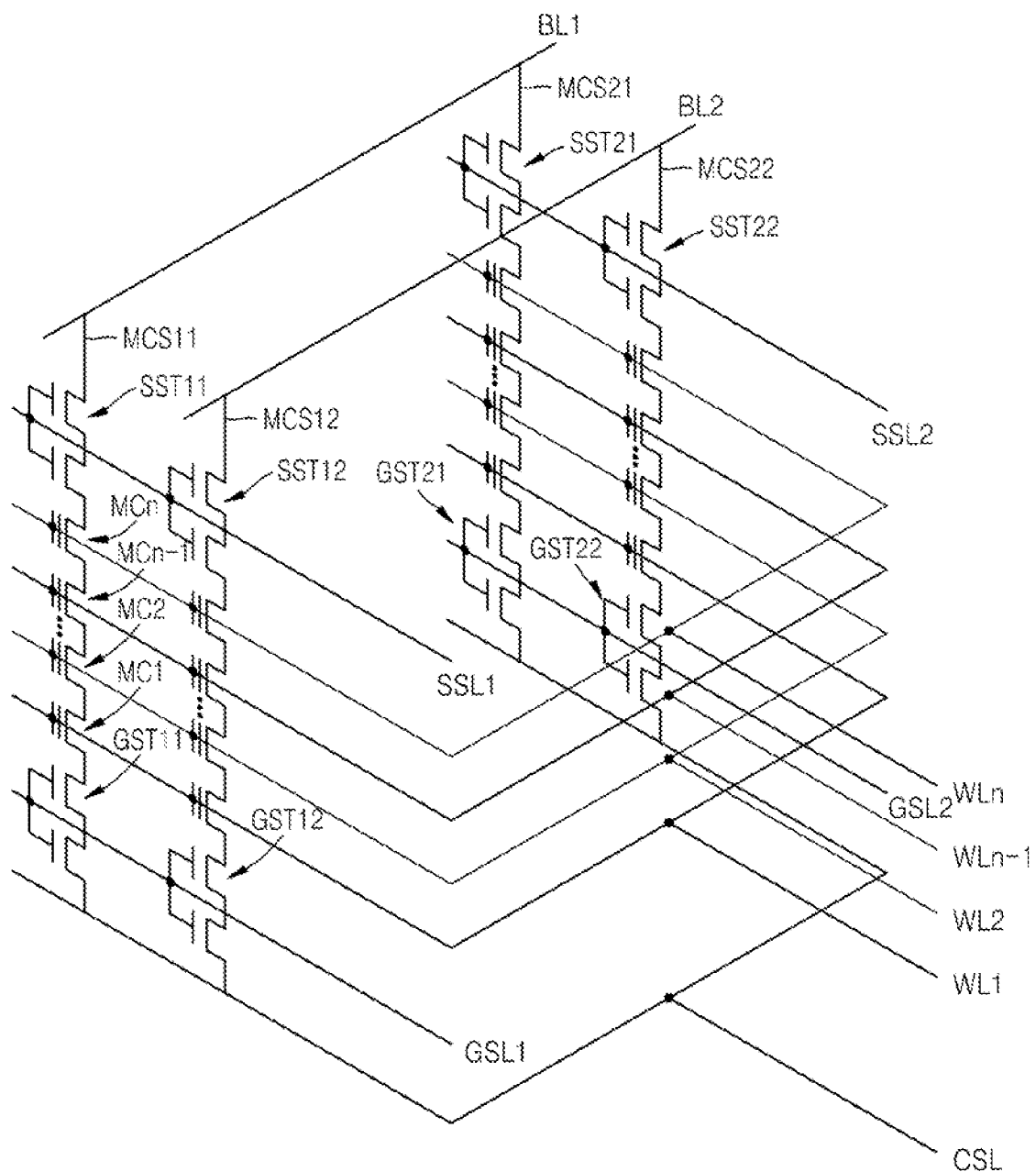
FIG. 2 is an equivalent circuit diagram of a non-volatile memory device according to an exemplary embodiment of the inventive concept.

FIG. 2 is an equivalent circuit diagram of a non-volatile memory device according to an exemplary embodiment of the inventive concept. The non-volatile memory device of FIG. 2 may correspond to an array using the memory cell string of FIG. 1. Thus, a description of operations or characteristics of elements that are the same as those of FIG. 1 will not be provided here.

For example, referring to FIG. 2, a plurality of memory cell strings MCS11, MCS12, MCS21, and MCS22 each having a vertical structure may be arranged in a matrix. A first bit line BL1 may be commonly connected to, for example, one end of the memory cell strings MCS11 and MCS21 in a first row, and a second bit line BL2 may be commonly connected to, for example, one end of the memory cell strings MCS12 and MCS22 in a second row. A common source line CSL may be disposed opposite to the first and second bit lines BL1 and BL2. For example, the common source line CSL may be commonly connected to the other ends of the memory cell strings MCS11, MCS12, MCS21, and MCS22. The total number of the memory cell strings MCS11, MCS12, MCS21, and MCS22 and the total number of the bit lines BL1 and BL2 are just examples thereof, and exemplary embodiments of the inventive concept are not limited thereto.

Word lines WL1 through WLn may be commonly connected to, for example, memory cells MC1 through MCn of the memory cell strings MCS11, MCS12, MCS21, and MCS22, arranged at the same levels as the word line WL1 through WLn, respectively. A first string selection line SSL1 may be commonly coupled to, for example, string selection transistors SST11 and SST12 of the memory cell strings MCS11 and MCS12 in a first column. A second string selection line SSL2 may be commonly coupled to, for example, string selection transistors SST21 and SST22 of the memory cell strings MCS21 and MCS22 in a second column. The string selection transistors SST11, SST12, SST21, and SST22 may respectively include, for example, the first and second string selection transistors SSTa and SSTb illustrated in FIG. 1. A first ground selection line GSL1 may be commonly connected to, for example, ground selection transistors GST11 and GST12 of the memory cell strings MCS11 and MCS12 in the first column. A second ground selection line GSL2 may be commonly connected to, for example, ground selection transistors GST21 and GST22 of the memory cell strings MCS21 and MCS22 in the second column. The ground selection transistors GST11, GST12, GST21, and GST22 may include, for example, the first and second ground selection transistors GSTa and GSTb illustrated in FIG. 1.

To perform a program operation of the non-volatile memory device, 0 volts may be applied to a bit line selected from the bit lines BL1 and BL2, and an 'ON' voltage may be applied to the other bit line for channel boosting. Also, the 'ON' voltage may be applied to a string selection line selected from the string selection lines SSL1 and SSL2 and an 'OFF' voltage may be applied to the other string selection line. Thus, it is possible to selectively operate a memory cell string that is commonly connected to the selected bit line and the selected string selection line, from among the memory cell strings MCS11, MCS12, MCS21, and MCS22.

To perform a read operation of the non-volatile memory device, a read voltage may be applied to a bit line selected from the bit lines BL1 and BL2 and the other bit line may be floated. Also, the 'ON' voltage may be applied to a string selection line selected from the string selection lines SSL1 and SSL2 and the 'OFF' voltage may be applied to the other string selection line. Thus, it is possible to selectively operate a memory cell string that is commonly connected to the selected bit line and the selected string selection line, from among the memory cell strings MCS11, MCS12, MCS21, and MCS22.

To perform an erase operation of the non-volatile memory device, an erase voltage may be applied to bodies of the memory cells MC1 through MCn and 0 volts may be applied to the word lines WL1 through WLn. Accordingly, data may be simultaneously erased from the memory cells MC1 through MCn of the memory cell strings MCS11, MCS12, MCS21, and MCS22.

Figure 3:
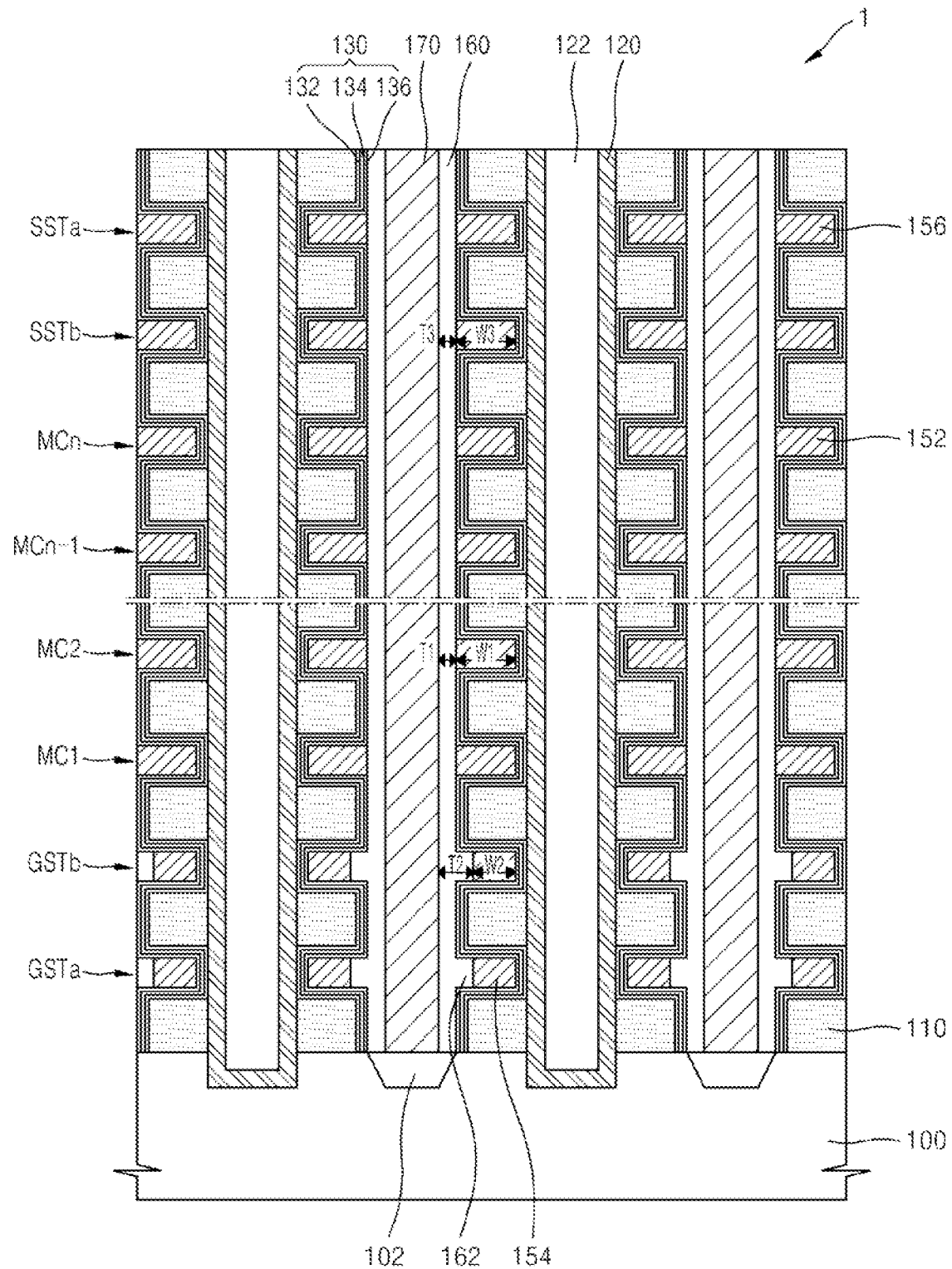
FIGS. 3 and 4 are schematic cross-sectional views of a non-volatile memory device according to an exemplary embodiment of the inventive concept.
Figure 4:
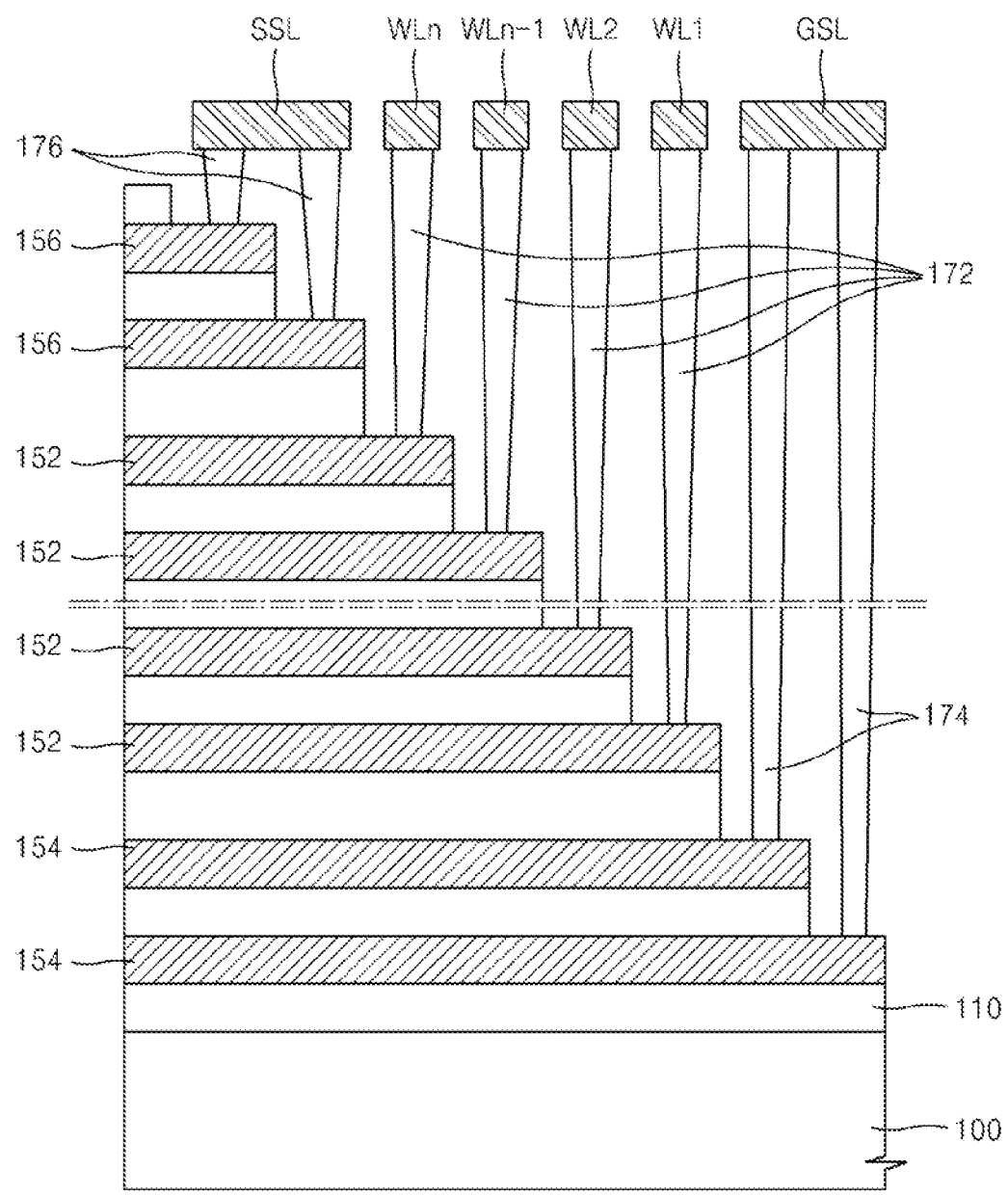

FIGS. 3 and 4 are schematic cross-sectional views of a non-volatile memory device 1 according to an exemplary embodiment of the inventive concept. FIG. 3 is a schematic cross-sectional view of memory cells of the non-volatile memory device 1.

FIG. 4 is a schematic cross-sectional view illustrating connections between the memory cells of the non-volatile memory device 1 and word lines.

Referring to FIG. 3, the non-volatile memory device 1 includes, for example, a semiconductor layer 100, a channel region 120, first control gate electrodes 152, second control gate electrodes 154, a common source line 170, and a sidewall insulation layer 160.

First and second ground selection transistors GSTa and GSTb, a plurality of memory cells MC1 through MCn, and first and second string selection transistors SSTa and SSTb may be located sequentially on the semiconductor layer 100. For example, the first and second ground selection transistors GSTa and GSTb may be located relatively near the semiconductor layer 100, and the first and second string selection transistors SSTa and SSTb may be located relatively far from the semiconductor layer 100. For example, interlayer insulation layers 110 may be located between the first and second ground selection transistors GSTa and GSTb, the plurality of memory cells MC1 through MCn, and the first and second string selection transistors SSTa and SSTb.

Each of the memory cells MC1 through MCn may include, for example, a storage structure 130. The storage structure 130 may include, for example, a tunneling insulation layer 132, a charge storage layer 134, and a blocking insulation layer 136. The memory cells MC1 through MCn may include, for example, the first control gate electrodes 152 electrically connected to the storage structure 130.

In addition, each of the first and second string selection transistors SSTa and SSTb and each of the first and second ground selection transistors GSTa and GSTb may include, for example, the storage structure 130, and this storage structure 130 may function as a gate insulation layer. The first and second ground selection transistors GSTa and GSTb may include, for example, the second control gate electrodes 154 electrically connected to the storage structure 130. The first and second string selection transistors SSTa and SSTb may include, for example, third control gate electrodes 156 electrically connected to the storage structure 130. A description of the first through third control gate electrodes 152, 154, and 156 will be provided in detail below.

The channel region 120 may extend, for example, in a vertical direction on a portion of the semiconductor layer 100. The first through third control gate electrodes 152, 154, and 156 may be arranged, for example, along a sidewall of the channel region 120. In addition, the storage structure 130 may, for example, continuously extend along the first through third control gate electrodes 152, 154, and 156, and thus the storage structure 130 may have a winding shape.

For example, a filling insulation layer 122 may be filled into the channel region 120. The channel region 120 may be physically and/or electrically connected to the storage structure 130. PN junction type source/drain regions for transistors may be formed in the channel region 120. In addition, the channel region 120 may be continuously doped or may not be doped with impurities of the same conductive type. In this case, the memory cells MC1 through MCn may be electrically connected to each other using, for example, a field effect source/drain region during a program/read operation. The channel region 120 between the memory cells MC1 through MCn may be turned on using, for example, a fringing field.

The common source line 170 may extend, for example, in the vertical direction on a portion of the semiconductor layer 100. An impurity region 102 may be located in the semiconductor layer 100, and the impurity region 102 and the common source line 170 may be physically and/or electrically connected to each other. The first and second ground selection transistors GSTa and GSTb, the plurality of memory cells MC1 through MCn, and the first and second string selection transistors SSTa and SSTb may be located between the channel region 120 and the common source line 170.

The sidewall insulation layer 160 may be located on the common source line 170. The sidewall insulation layer 160 may extend, for example, in the vertical direction on the semiconductor layer 100. In addition, the sidewall insulation layer 160 may be, for example, opposite to the channel region 120 with respect to the transistors. That is, the transistors are disposed between the sidewall insulation layer 160 and the channel region 120. The common source line 170 may be insulated from the first and second ground selection transistors GSTa and GSTb, the plurality of memory cells MC1 through MCn, and the first and second string selection transistors SSTa and SSTb by the sidewall insulation layer 160.

The sidewall insulation layer 160 may have, for example, one or more protrusion regions 162 protruded toward the second control gate electrodes 154 in a region where the second control gate electrodes 154 are located. The first control gate electrodes 152 may be arranged, for example, in the vertical direction on the semiconductor layer 100 and in contact with portions of the sidewall insulation layer 160 where the protrusion regions 162 are not formed. That is, the first control gate electrodes 152 may be located so as, for example, not to contact with the protrusion regions 162. On the other hand, the second control gate electrodes 154 may be arranged, for example, in the vertical direction on the semiconductor layer 100 and in contact with the protrusion regions 162. The second control gate electrodes 154 may be, for example, located near to the semiconductor layer 100 compared to the first control gate electrodes 152.

The first control gate electrodes 152 may have the same width as or different widths from each other between the sidewall insulation layer 160 and the channel region 120. In addition, the second control gate electrodes 154 may have the same width as or different widths from each other between the sidewall insulation layer 160 and the channel region 120. For example, the first control gate electrodes 152 may have a first width W1 between the sidewall insulation layer 160 and the channel region 120, and the second control gate electrodes 154 may have a second width W2 between the sidewall insulation layer 160 and the channel region 120. The second width W2 may be, for example, narrower than the first width W1.

For example, the sidewall insulation layer 160 may have a first thickness T1 between the first control gate electrodes 152 and the common source line 170. The sidewall insulation layer 160 may have a second thickness T2 between the second control gate electrodes 154 and the common source line 170. The second thickness T2 may be, for example, thicker than the first thickness T1. In the current embodiment, the third control gate electrodes 156 may have, for example, a third width W3 between the sidewall insulation layer 160 and the channel region 120, and the third width W3 may be the same as the first width W1. In addition, the sidewall insulation layer 160 may have a third thickness T3 between the third control gate electrodes 156 and the common source line 170. In the current embodiment, the first thickness T1 and the third thickness T3 may be, for example, the same. Each of the first thicknesses T1 corresponding to the first control gate electrodes 152 may be same as or different from each other. In addition, each of the second thicknesses T2 corresponding to second control gate electrodes 154 may be same as or different from each other. Moreover, each of the third thickness T3 corresponding to the third control gate electrodes 156 may be the same as or different from each other.

As a result, the memory cells MC1 through MCn include the first control gate electrodes 152 each having the first width W1, and the first and second ground selection transistors GSTa and GSTb include the second control gate electrodes 154 each having the second width W2, which is narrower than the first width W1. The first and second string selection transistors SSTa and SSTb include the third control gate electrodes 156 each having the third width W3, which is the same width as the first width W1.

Referring to FIG. 4, the first control gate electrodes 152 of the memory cells MC1 through MCn may be connected to, for example, word lines WL1 through WLn through first contact plugs 172. The second control gate electrodes 154 of the first and second ground selection transistors GSTa and GSTb may be commonly connected to, for example, a ground selection line GSL through second contact plugs 174. The third control gate electrodes 156 of the first and second string selection transistors SSTa and SSTb may be commonly connected to, for example, a string selection line SSL through third contact plugs 176. The single ground selection line GSL and the single string selection line SSL are illustrated, but this is just an example, and exemplary embodiments of the inventive concept are not limited thereto.

FIGS. 5 through 17 are schematic cross-sectional views illustrating a method of fabricating a non-volatile memory device according an exemplary embodiment of the inventive concept.

Figure 5:
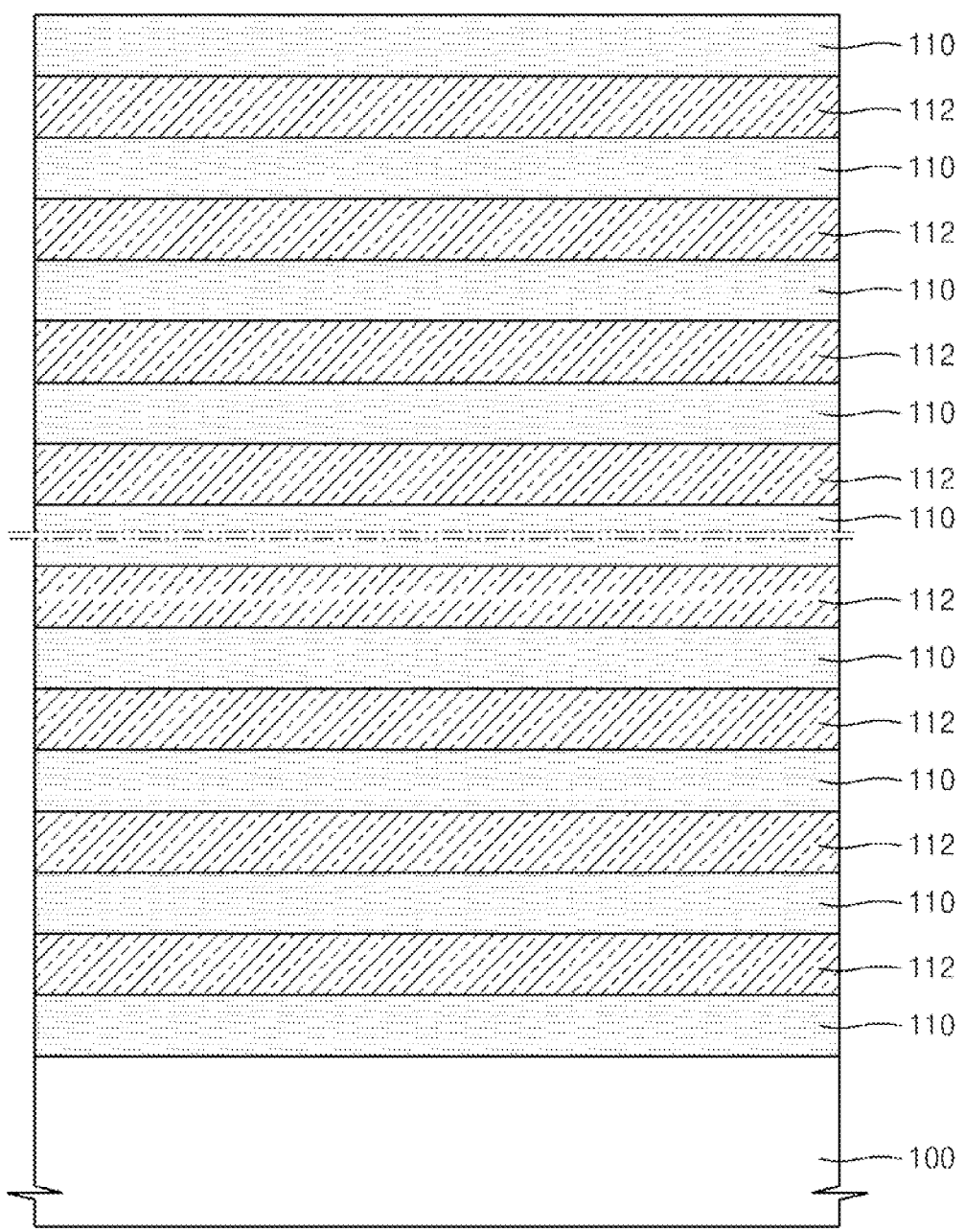
FIGS. 5 through 17 are schematic cross-sectional views illustrating a method of fabricating a non-volatile memory device according an exemplary embodiment of the inventive concept.

Referring to FIG. 5, a semiconductor layer 100 is prepared. The semiconductor layer 100 may be a substrate and may include a semiconductor material, such as for example, a IV group semiconductor, a III-V group compound semiconductor, or a II-VI group oxide semiconductor. For example, the IV group semiconductor may include silicon (Si), germanium (Ge), or silicon-germanium (Si—Ge). The semiconductor layer 100 may include, for example, a bulk wafer, an epitaxial layer, a silicon-on-insulator (SOI) layer, a semiconductor-on-insulator (SEOI) layer, and/or the like.

For example, interlayer insulation layers 110 and interlayer sacrificial layers 112 may be alternately formed on the semiconductor layer 100. The interlayer sacrificial layers 112 may have, for example, an etch selectivity different from that of the interlayer insulation layers 110. The etch selectivity of the interlayer sacrificial layers 112 may be quantitatively represented by a ratio of an etching rate of the interlayer sacrificial layers 112 to an etching rate of the interlayer insulation layers 110. The interlayer insulation layers 110 and the interlayer sacrificial layers 112 may include, for example, materials different from each other. For example, the interlayer insulation layers 110 may include silicon oxide or silicon nitride, and the interlayer sacrificial layers 112 may include silicon, silicon oxide, silicon carbide, or silicon nitride. Although, in FIG. 5, the interlayer insulation layers 110 is located closer to the semiconductor layer 100 compared to the interlayer sacrificial layers 112, exemplary embodiments of the inventive concept are not limited thereto. For example, alternatively, the interlayer sacrificial layers 112 may be located closer to the semiconductor layer 100 compared to the interlayer insulation layers 110. In addition, the thicknesses of the interlayer insulation layers 110 and the interlayer sacrificial layers 112 may be variously changed, and the numbers of layers of the interlayer insulation layers 110 and the interlayer sacrificial layers 112 also may be variously changed.

Figure 6:
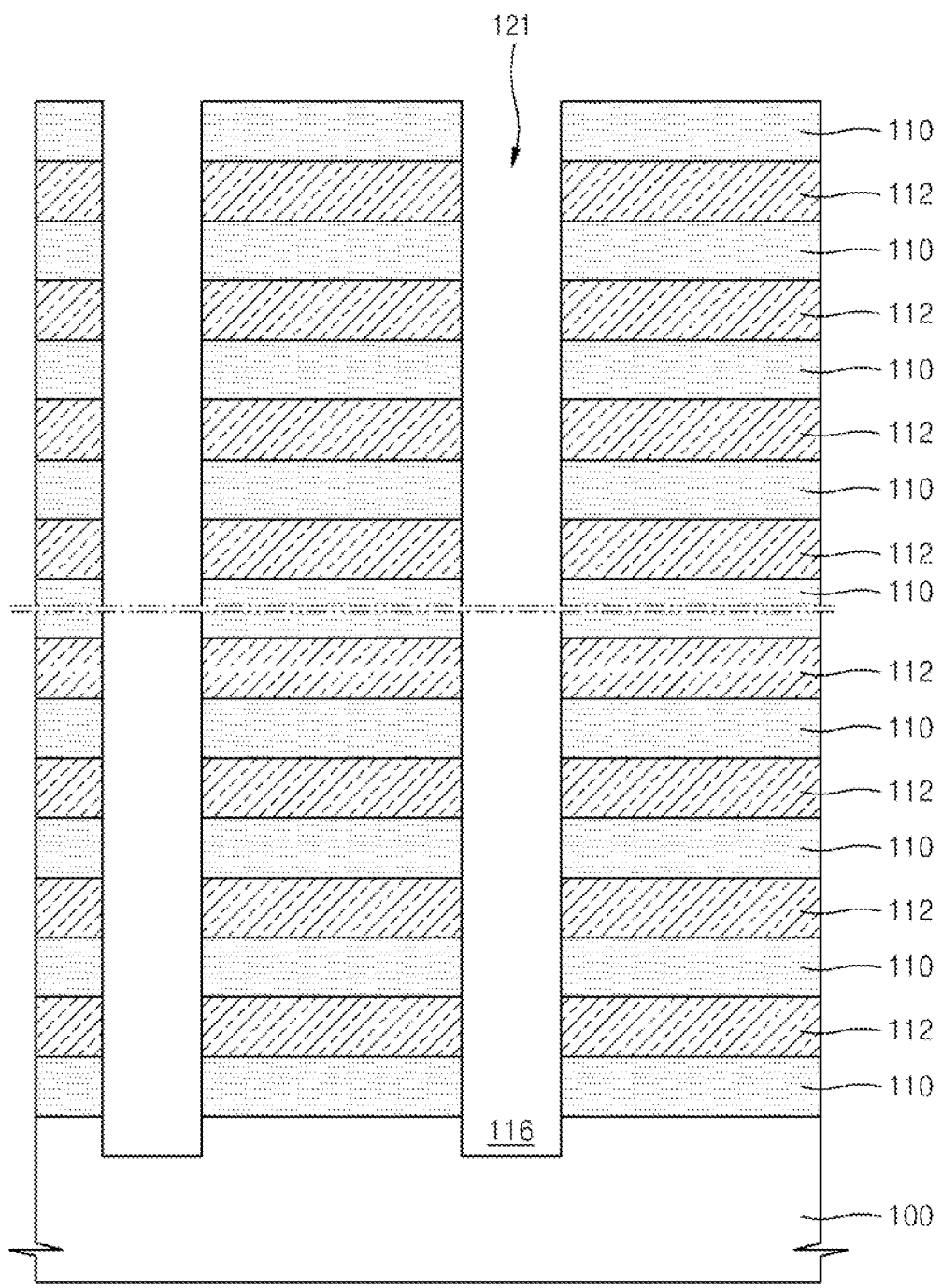

For example, referring to FIG. 6, first opening portions 121 may be formed to expose the semiconductor layer 100 by removing some portions of the interlayer insulation layers 110 and the interlayer sacrificial layers 112. The first opening portions 121 may be formed by using, for example, a photolithography process and an etching process. Sidewalls of the first opening portions 121 may be perpendicular or may not be perpendicular to a top side of the semiconductor layer 100. For example, widths of the first opening portions 121 may be smaller when closer to the semiconductor layer 100. In addition, the first opening portions 121 may also be formed to have, for example, a recess portion 116 formed by recessing the semiconductor layer 100 to a predetermined depth.

Figure 7:
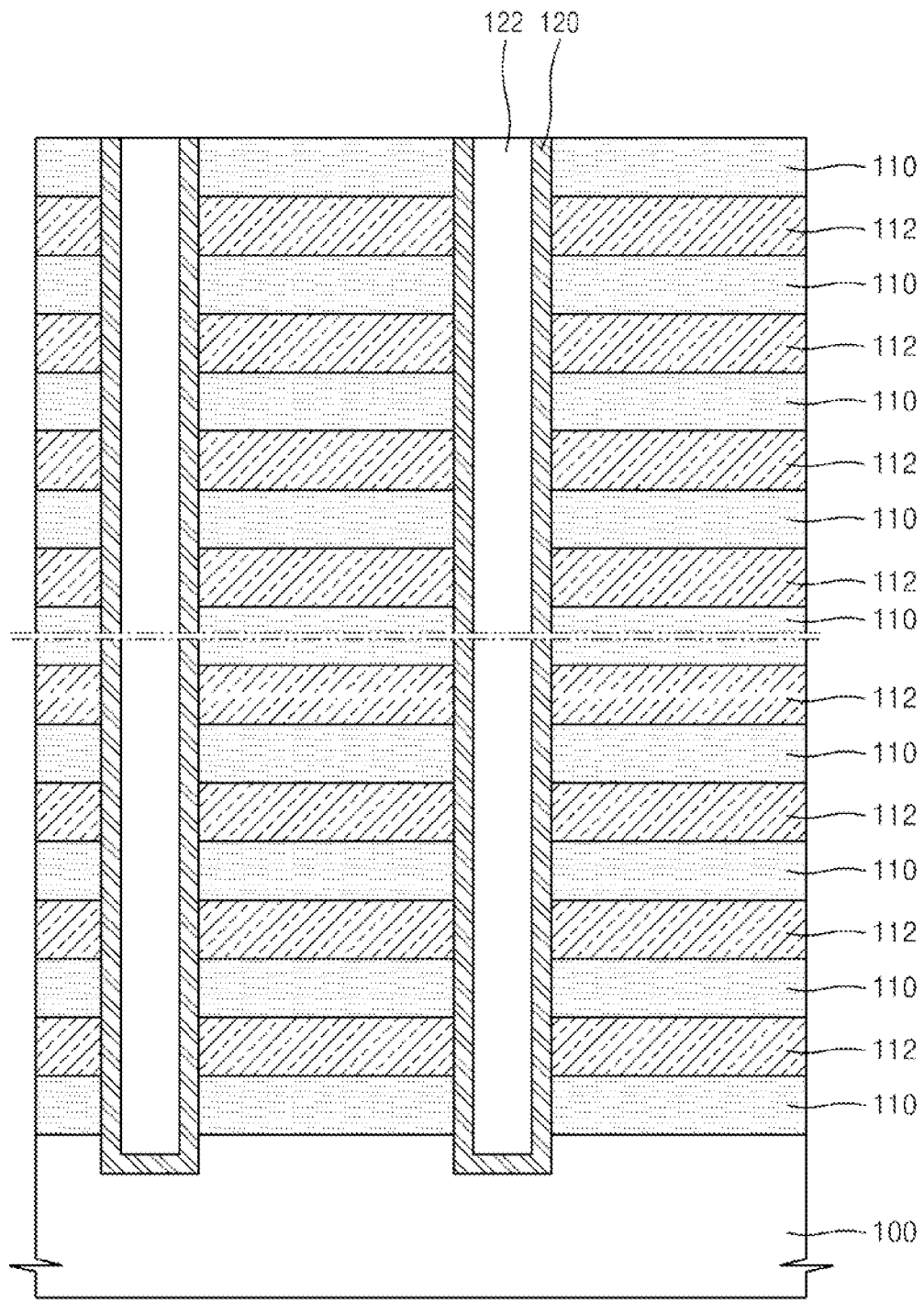

For example, referring to FIG. 7, channel regions 120 may be formed so as to uniformly cover the sidewalls and a lower side of the first opening portions 121. The channel regions 120 may have, for example, a polycrystalline structure or a monocrystalline structure. The channel regions 120 may be, for example, epitaxial layers. The channel regions 120 may be formed by using, for example, chemical vapor deposition (CVD), atomic layer deposition (ALD), sputtering, electroplating or non-electroplating. The channel regions 120 may be electrically connected to the semiconductor layer 100 by, for example, directly contacting with the semiconductor layer 100 at bottom sides of the first opening portions 121. Furthermore, the first opening portions 121 may be filled by, for example, forming filling insulation layers 122. For example, selectively, before forming the filling insulation layers 122, a hydrogen annealing process may be further performed in a gas atmosphere including hydrogen or heavy hydrogen to thermally process the channel regions 120. Due to the hydrogen annealing process, defects of the channel regions 120 may be removed. In addition, without forming the filling insulation layers 122, the channel regions 120 may completely fill the first opening portions 121. Although not illustrated, a bit line contact plug (not shown) may be further formed to electrically contact with a bit line in top portions of the channel regions 120.

Figure 8:
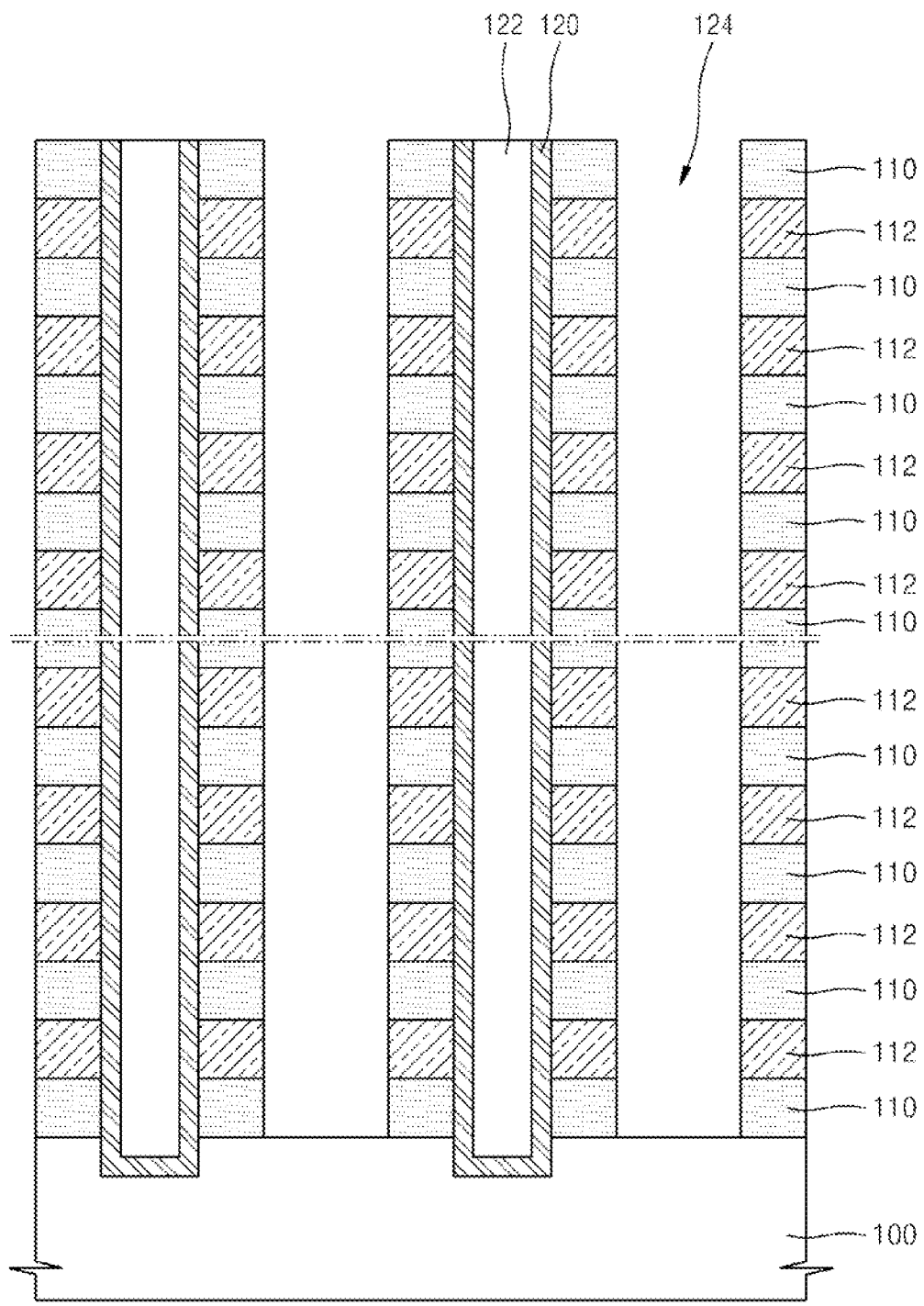

For example, referring to FIG. 8, second opening portions 124 exposing the semiconductor layer 100 may be formed by removing some portions of the interlayer insulation layers 110 and the interlayer sacrificial layers 112 between the channel regions 120. The second opening portions 124 may be formed by using, for example, a photolithography process and an etching process. Sidewalls of the second opening portions 124 may be perpendicular or may not be perpendicular to the top side of the semiconductor layer 100.

Figure 9:
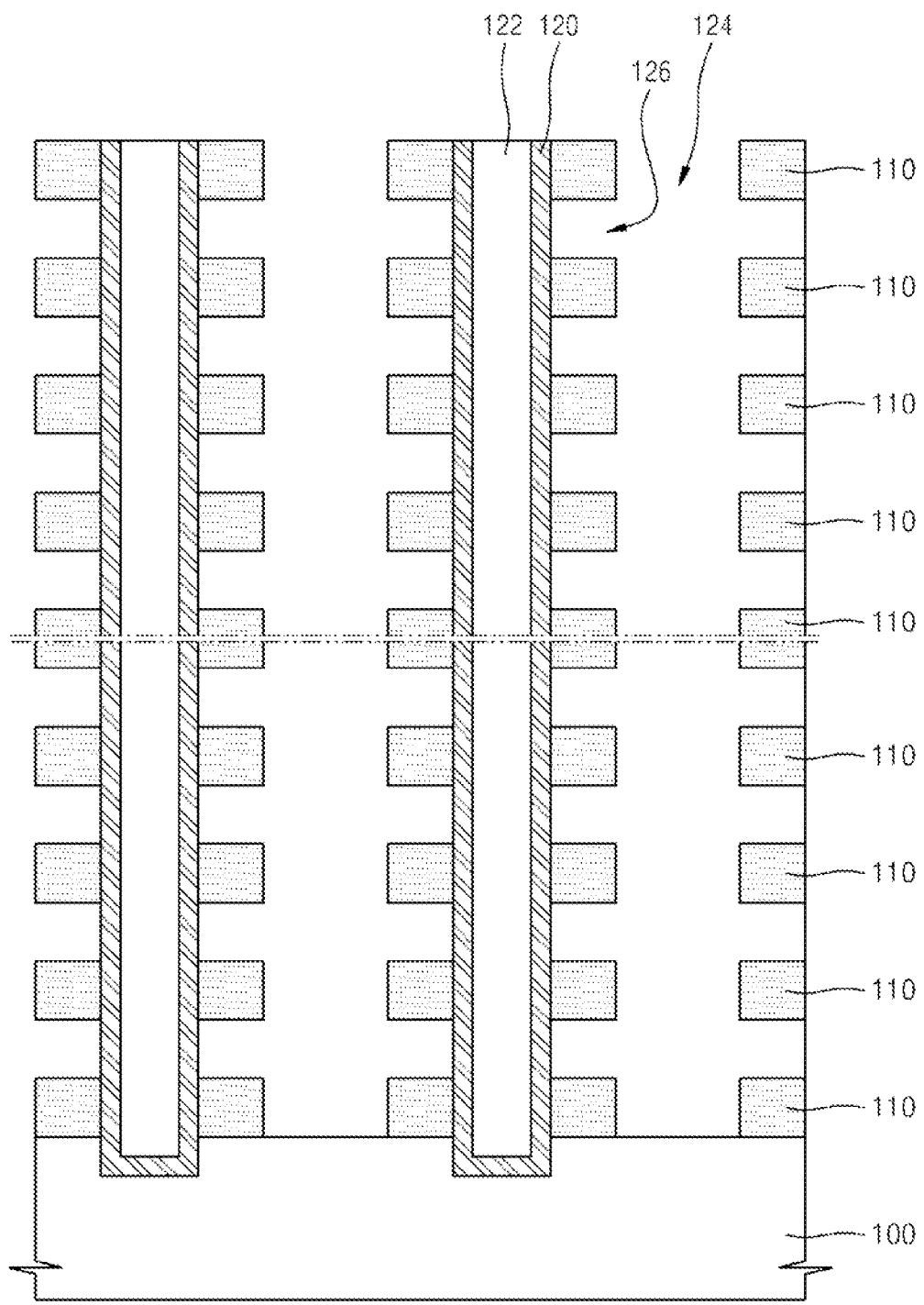

Referring to FIG. 9, the interlayer sacrificial layers 112 interposed between the interlayer insulation layers 110 may be removed. For example, the interlayer sacrificial layers 112 may be removed by infiltrating an etchant into spaces between the interlayer insulation layers 110 through the second opening portions 124. The removing operation, for example, may include wet etching or chemical dry etching. Accordingly, third opening portions 126 connected to the second opening portions 124 may be formed as the interlayer sacrificial layers 112 interposed between the interlayer insulation layers 110 are removed. Due to the third opening portions 126, sidewalls of the channel regions 120 may be exposed.

Figure 10:
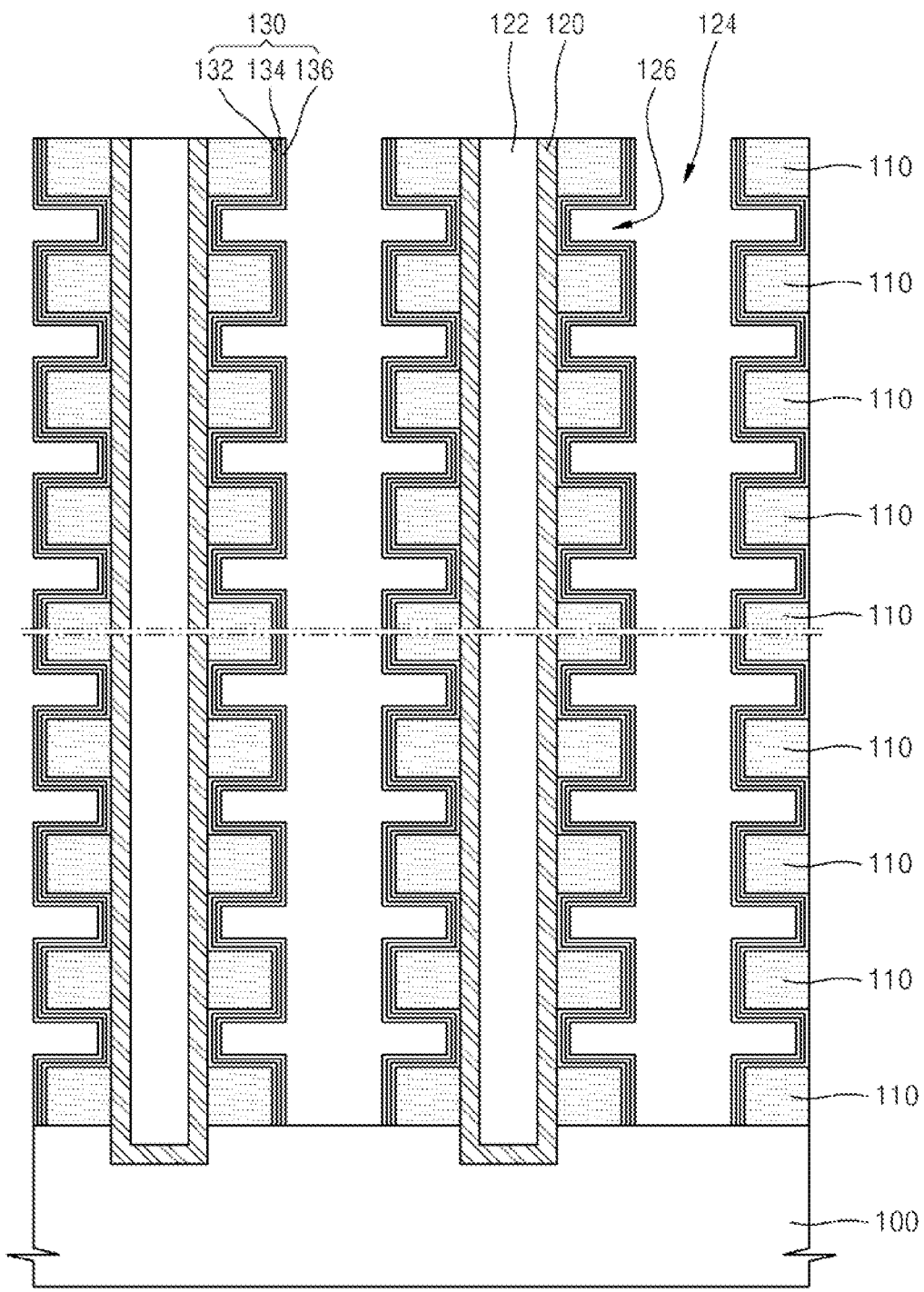

For example, referring to FIG. 10, storage structures 130 may be formed on sidewalls of the interlayer insulation layers 110 and on the sidewalls of the channel regions 120, which are exposed by the second opening portions 124 and the third opening portions 126. The storage structures 130 may be formed by, for example, using a method providing high step coverage. For example, the storage structures 130 may be formed by using CVD, ALD, sputtering, electroplating or non-electroplating. Each of the storage structures 130 may have, for example, a tunneling insulation layer 132, a charge storage layer 134, and a blocking insulation layer 136. The tunneling insulation layer 132 may be formed, for example, to contact the channel regions 120. The charge storage layer 134 and the blocking insulation layer 136 may be formed, for example, sequentially on the tunneling insulation layer 132.

The tunneling insulation layer 132 may include, for example, one or more of silicon oxide ($SiO_2$), silicon nitride ($Si_3N_4$), silicon oxide nitride (SiON), hafnium oxide ($HfO_2$), hafnium silicon oxide ($HfSi_xO_y$), aluminum oxide ($Al_2O_3$), and zirconium oxide ($ZrO_2$).

The charge storage layer 134, for example, may be a floating gate including polysilicon. In addition, the charge storage layer 134 may be a charge trap layer including, for example, one or more of silicon oxide ($SiO_2$), silicon nitride ($Si_3N_4$), silicon oxide nitride (SiON), hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), hafnium tantalum oxide ($HfTa_xO_y$), hafnium silicon oxide ($HfSi_xO_y$), aluminum nitride ($Al_xN_y$), and aluminum gallium nitride (AlGaN). In addition, the charge storage layer 134 may include, for example, quantum dots for trapping charges.

The blocking insulation layer 136 may include, for example, one or more of silicon oxide ($SiO_2$), silicon nitride ($Si_3N_4$), silicon oxide nitride (SiON), and a dielectric material having a high dielectric constant (high-k). The dielectric material having a high dielectric constant (high-k) may include, for example, at least one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

Figure 11:
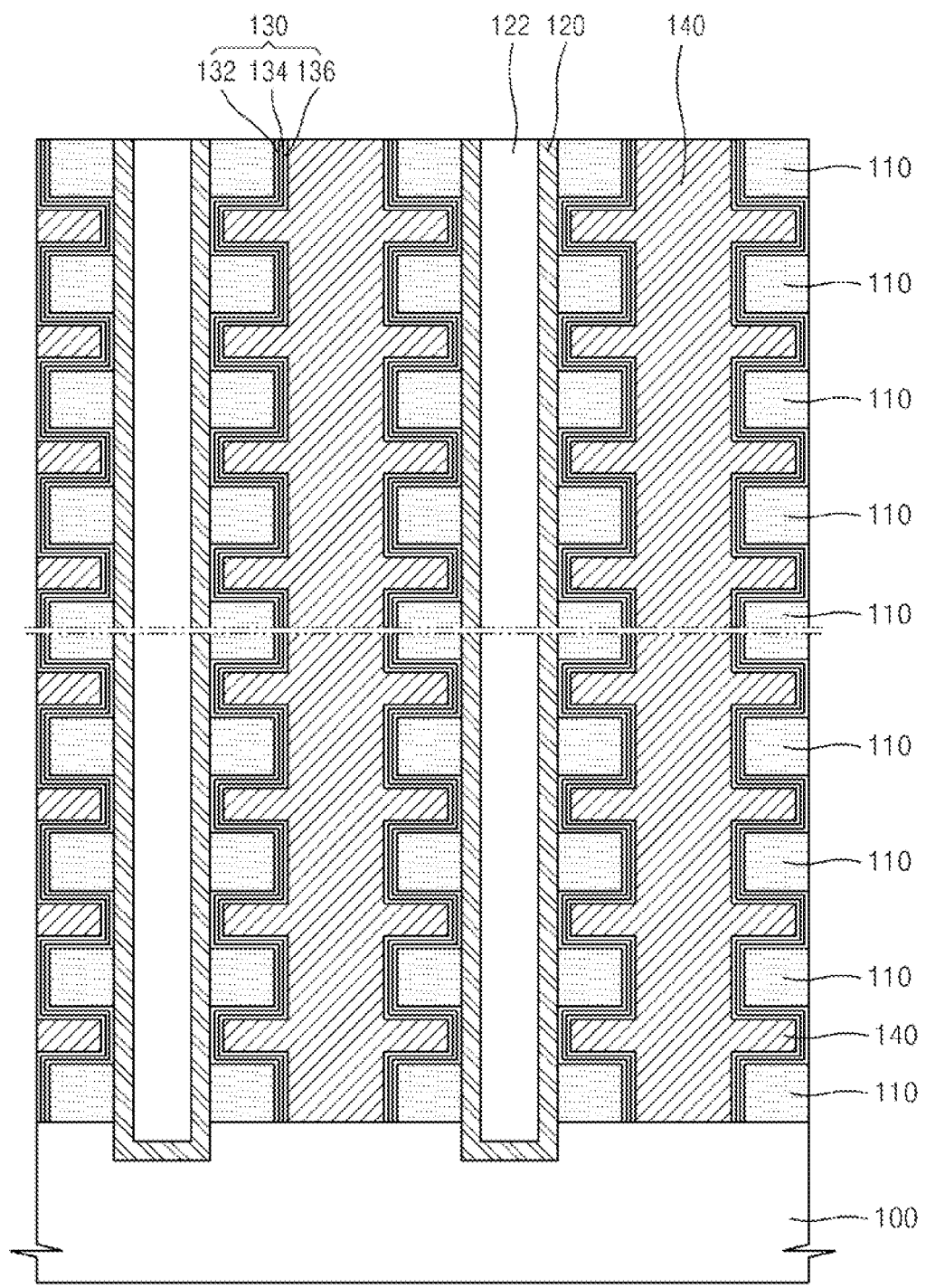

For example, referring to FIG. 11, interlayer conductive layers 140 may be formed on the storage structures 130 so as to fill the second opening portions 124 and the third opening portions 126. The interlayer conductive layers 140 may be formed by using, for example, a method providing high step coverage. For example, the interlayer conductive layers 140 may be formed by using CVD, ALD, sputtering, electroplating or non-electroplating. The interlayer conductive layers 140 may include, for example, one or more of polysilicon, aluminum (Al), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr), a nitride thereof, and a silicide thereof. A reaction source for the formation of the interlayer conductive layers 140 may be supplied from, for example, an upper side of the second opening portions 124 downward. Accordingly, to form the interlayer conductive layers 140 without a void inside the third opening portions 126, the second opening portions 124 should not be blocked before the interlayer conductive layers 140 fill the third opening portions 126.

Figure 12:
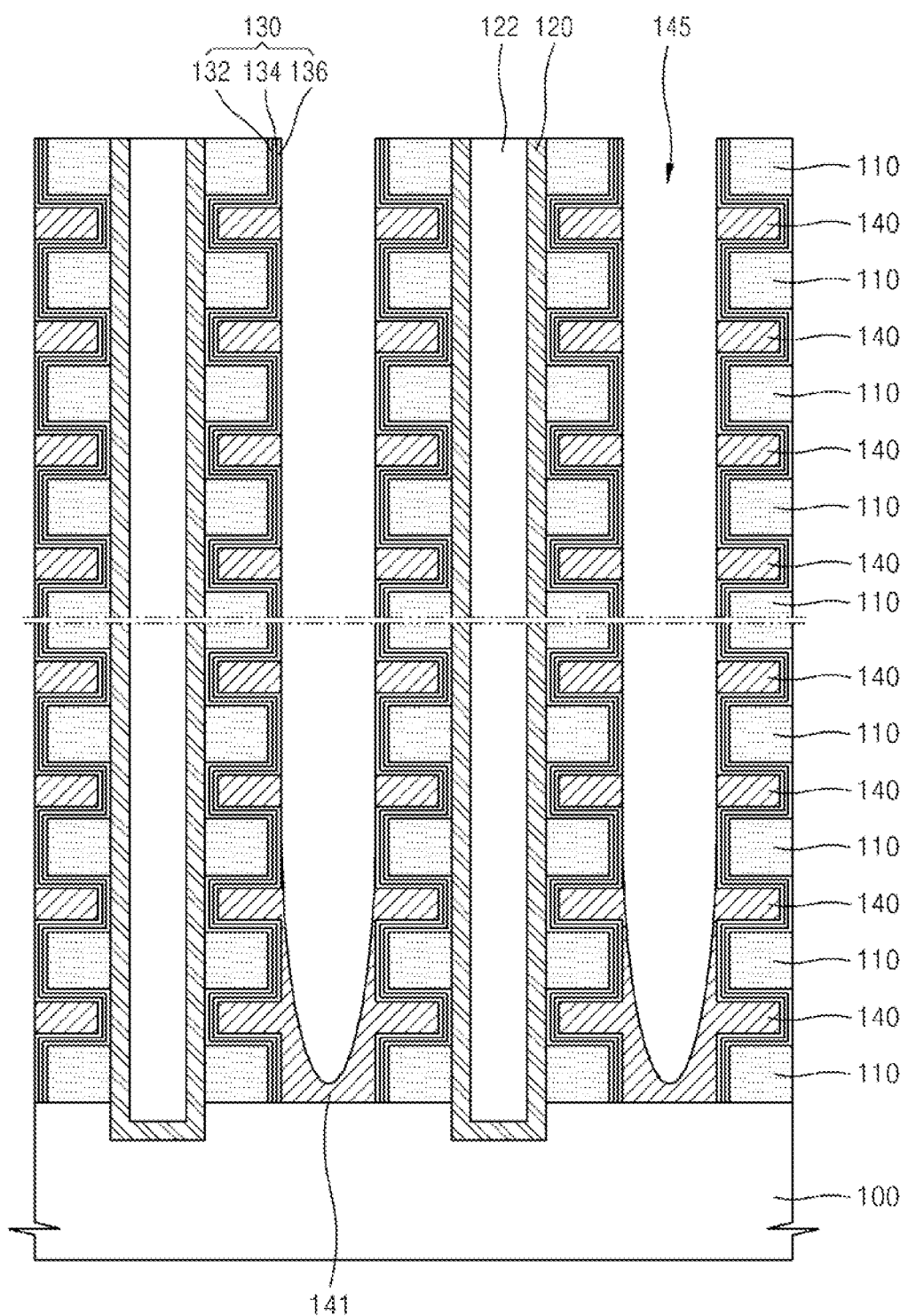

For example, referring to FIG. 12, fourth opening portions 145 may be formed by removing some portions of the interlayer conductive layers 140. The fourth opening portions 145 may be formed by using, for example, a photolithography process and an etching process. The fourth opening portions 145 may expose sidewalls of the storage structures 130. In certain circumstances, the sidewalls of the storage structures 130 may be further removed, and thus the fourth opening portions 145 may expose the sidewalls of the interlayer insulation layers 110. Here, the sides of the interlayer conductive layers 140 may be, for example, coplanar with sides of the storage structures 130. For example, the interlayer conductive layers 140, which constitute control gate electrodes of memory cells formed by a following process, may have a uniform thickness from the storage structures 130.

Sidewalls of the fourth opening portions 145 may be perpendicular or may not be perpendicular to the top side of the semiconductor layer 100. For example, widths of the fourth opening portions 145 may be smaller when closer to the semiconductor layer 100. A remaining conductive layer 141 may exist, for example, adjacent to the semiconductor layer 100. The remaining conductive layer 141 may cover, for example, the top side of the semiconductor layer 100 and the sidewalls of the interlayer insulation layers 110 located under the interlayer conductive layers 140 remaining in the third opening portions 126. This remaining conductive layer 141 should be removed for forming individual nodes. If the present process is continued until the remaining conductive layer 141 is removed, the sidewalls of the interlayer insulation layers 110 located above the remaining conductive layer 141 may be recessed inward compared to the sidewalls of the storage structures 130. In this case, the uniformity of the widths of the control gate electrodes of the memory cells to be formed may be deteriorated, and thus the reliability of the memory device may be deteriorated.

Figure 13:
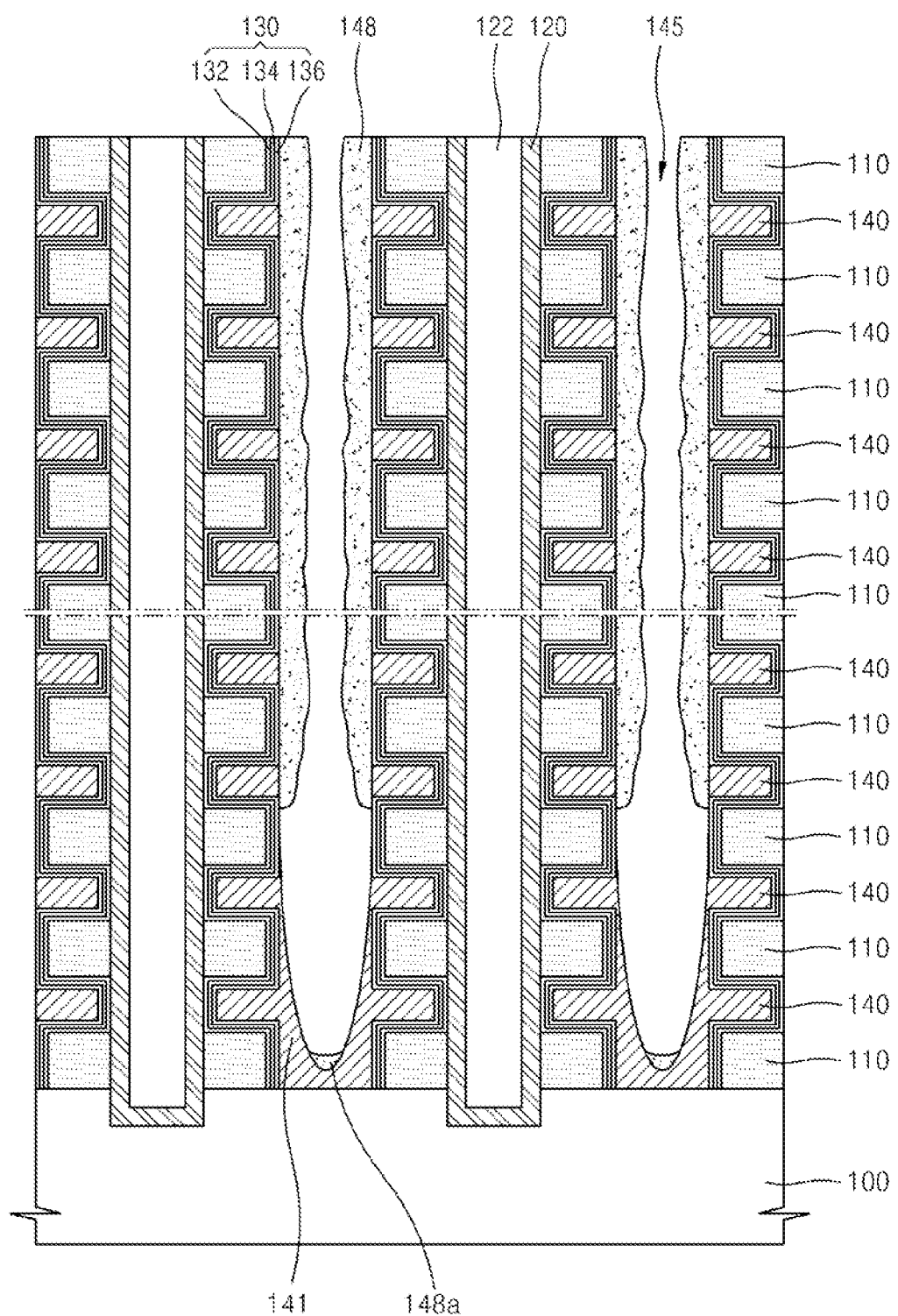

For example, referring to FIG. 13, a first sacrificial spacer 148 is formed in the fourth opening portions 145. The first sacrificial spacer 148 may be formed, for example, so as to have low step coverage. For example, the first sacrificial spacer 148 may be formed in upper regions of the fourth opening portions 145, and the sacrificial spacer 148 may not be formed in lower regions of the fourth opening portions 145, such as, in regions adjacent to the semiconductor layer 100. Thus, the first sacrificial spacer 148 may cover sidewalls of portions of the interlayer conductive layers 140 and sidewalls of portions of the interlayer insulation layers 110 located relatively far from the semiconductor layer 100. In addition, the first sacrificial spacer 148 may not be formed on sidewalls of portions of the interlayer conductive layers 140 and sidewalls of portions of the interlayer insulation layers 110 located relatively close to the semiconductor layer 100. The portions of the interlayer conductive layers 140 that are not covered by the first sacrificial spacer 148 may constitute the second control gate electrodes 154 (see FIG. 3) of first and second ground selection transistors GSTa and GSTb (see FIG. 3) in a following process.

The first sacrificial spacer 148 may be formed, for example, so as not to cover the remaining conductive layer 141, and thus may function as a mask for removing the remaining conductive layer 141 in a following process. However, a second sacrificial spacer 148a may be formed, for example, on a portion of the remaining conductive layer 141 remaining on the semiconductor layer 100. In addition, a process of forming the first sacrificial spacer 148 should be controlled so that the fourth opening portions 145 are not closed by the first sacrificial spacer 148.

The first sacrificial spacer 148 may include, for example, a material having an etch selectivity that is different from those of the interlayer conductive layers 140 and the interlayer insulation layers 110. In addition, the first sacrificial spacer 148 may include, for example, a material having an etch selectivity that is different from that of the storage structures 130 and may also include a material having an etch selectivity, for example, that is different from that of the blocking insulation layer 136. For example, if the interlayer insulation layers 110 or the blocking insulation layer 136 include silicon nitride, the first sacrificial spacer 148 may include silicon oxide. The first sacrificial spacer 148 may be formed of a single layer or a compound layer including a plurality of layers.

As stated above, the first sacrificial spacer 148 is formed to have, for example, low step coverage. For this, for example, a process temperature, a total pressure of a mixture of a reaction gas and a carrier gas, and a concentration of the reaction gas used to from the first sacrificial spacer 148 are properly controlled. For example, the first sacrificial spacer 148 may be formed to have low step coverage by increasing a formation rate of the first sacrificial spacer 148. The formation rate may be determined by a nucleation rate and a growth rate of the first sacrificial spacer 148. If the nucleation rate is higher than the growth rate, the first sacrificial spacer 148 may be formed uniformly. On the other hand, if the growth rate is higher than the nucleation rate, the first sacrificial spacer 148 may not be formed uniformly. Thus, process conditions may be established in which the growth rate is higher than the nucleation rate, to form the first sacrificial spacer 148 having low step coverage, and the process conditions for embodying this may be variously changed. For example, when the process temperature used to form the sacrificial spacer 148 is raised, occurrence of a chemical reaction of the reaction gas used to form the sacrificial spacer 148 is increased, and thus the growth rate of the first sacrificial spacer 148 may be increased. On the other hand, in certain circumstances, when the process temperature is raised, a material constituting the first sacrificial spacer 148 may be changed from a gas state to a solid state, and thus the growth rate of the first sacrificial spacer 148 may be increased. In addition, as the total pressure of the mixture of the reaction gas and the carrier gas is increased or the concentration of the reaction gas is increased, the growth rate of the first sacrificial spacer 148 may be increased. In addition, in certain circumstances, as the total pressure of the mixture of the reaction gas and the carrier gas is decreased or the concentration of the reaction gas is decreased, nucleation sites for forming the first sacrificial spacer 148 may be decreased, and thus the nucleation rate may be more decreased compared to the growth rate. As a result, the growth rate of the first sacrificial spacer 148 may be greater than the nucleation rate, and thus the first sacrificial spacer 148 having low step coverage may be formed.

As another example, after forming a layer filling the fourth opening portions 145, the first sacrificial spacer 148 may be formed by, for example, removing a portion of the layer. In addition, after forming a layer covering the sidewalls of the interlayer insulation layers 110 and the sidewalls of the interlayer conductive layers 140, the first sacrificial spacer 148 may be formed by, for example, removing a portion of the layer so as to expose the interlayer insulation layers 110 and the interlayer conductive layers 140 located relatively close to the semiconductor layer 100.

Figure 14:
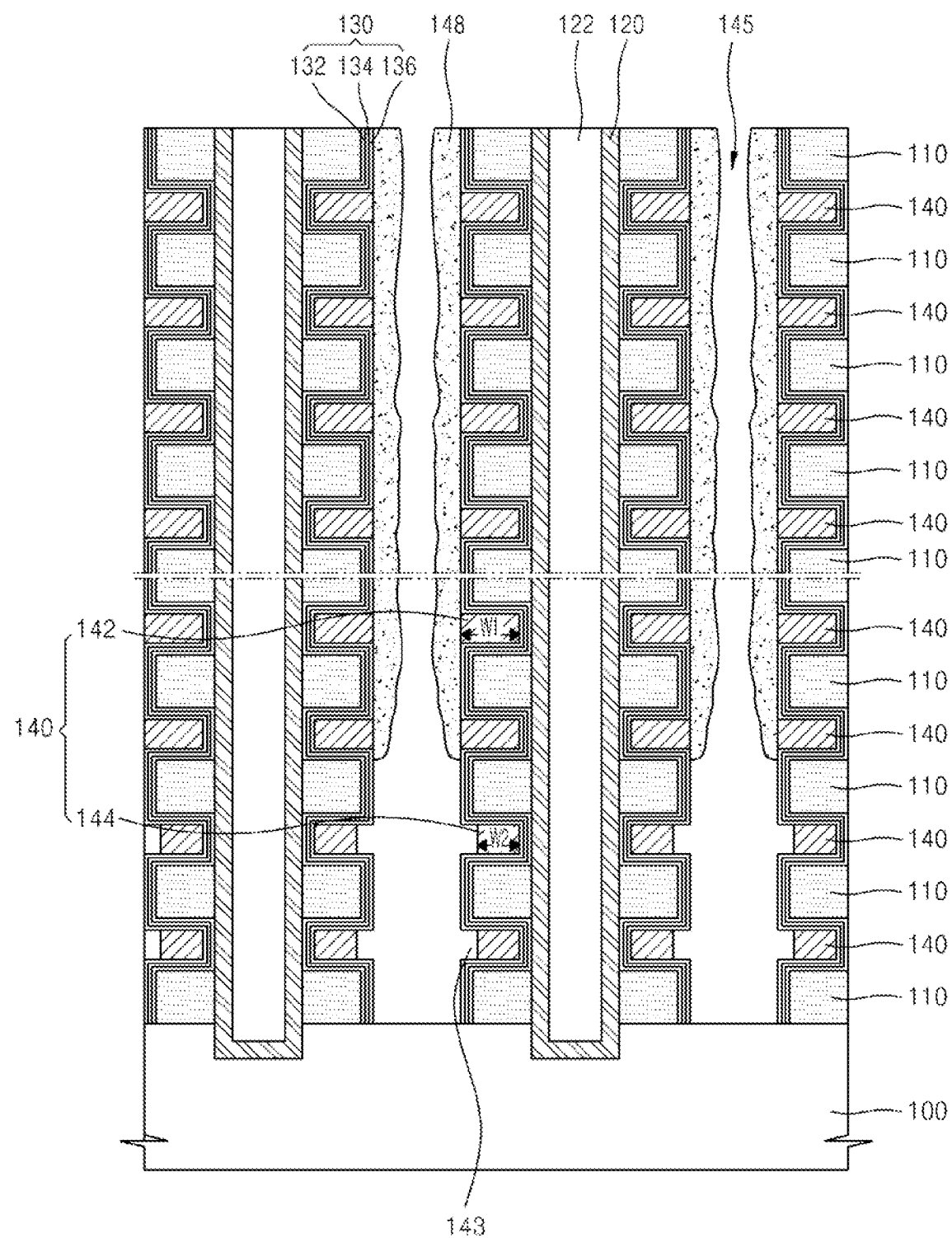

Referring to FIG. 14, the remaining conductive layer 141 is removed by using, for example, the first sacrificial spacer 148 as a mask. Here, the second sacrificial spacer 148a located on the remaining conductive layer 141 remaining on the semiconductor layer 100 may be removed previously or at the same time. In addition, the semiconductor layer 100 may be exposed by removing the remaining conductive layer 141 remaining on the semiconductor layer 100. In addition, for example, the interlayer conductive layers 140 located relatively close to the semiconductor layer 100 may be further removed, and thus a recess portion 143 recessed compared to the sidewalls of the interlayer insulation layers 110 may be formed. Thus, the interlayer conductive layers 140 may include, for example, a first interlayer conductive layer 142 that does not have the recess portion 143, and a second interlayer conductive layer 144 having the recess portion 143. For example, first interlayer conductive layer 142 may have a first width W1, and the second interlayer conductive layer 144 may have a second width W2. The second width W2 may be, for example, narrower compared to the first width W1.

Figure 15:
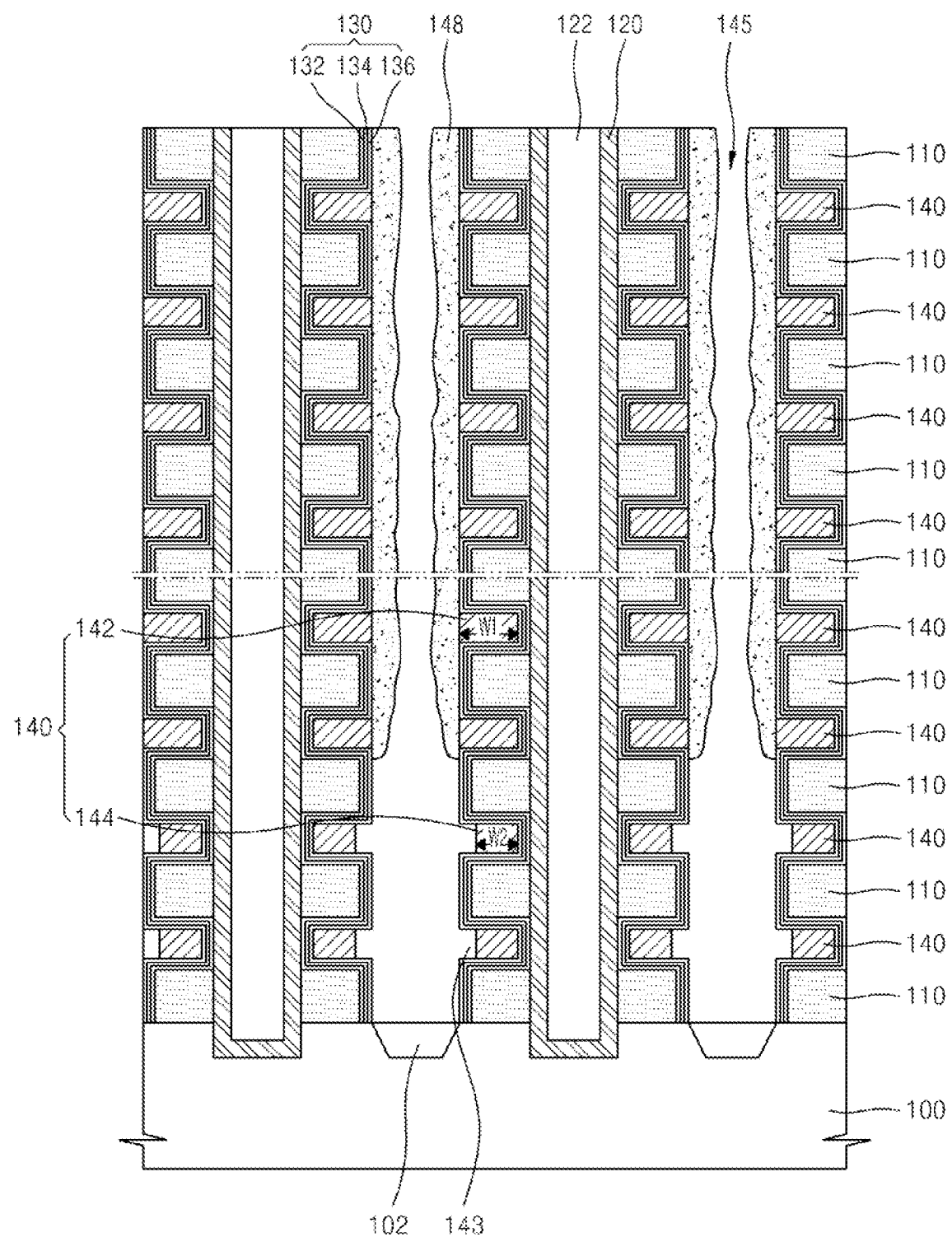

For example, referring to FIG. 15, an impurity region 102 may be formed by injecting impurities into the exposed semiconductor layer 100 through the fourth opening portions 145. The impurities may be, for example, N-type impurities such as phosphorus (P), arsenic (As), antimony, or the like, or may be P-type impurities such as, for example, boron B, aluminum (Al), gallium (Ga), zinc (Zn), or the like. The impurity region 102 may be, for example, a source region and may form a PN junction together with the semiconductor layer 100. In addition, for example, before performing the process of forming the interlayer insulation layers 110 and the interlayer sacrificial layers 112 explained above with reference to FIG. 5, the impurity region 102 may be previously formed on the semiconductor layer (100).

Figure 16:
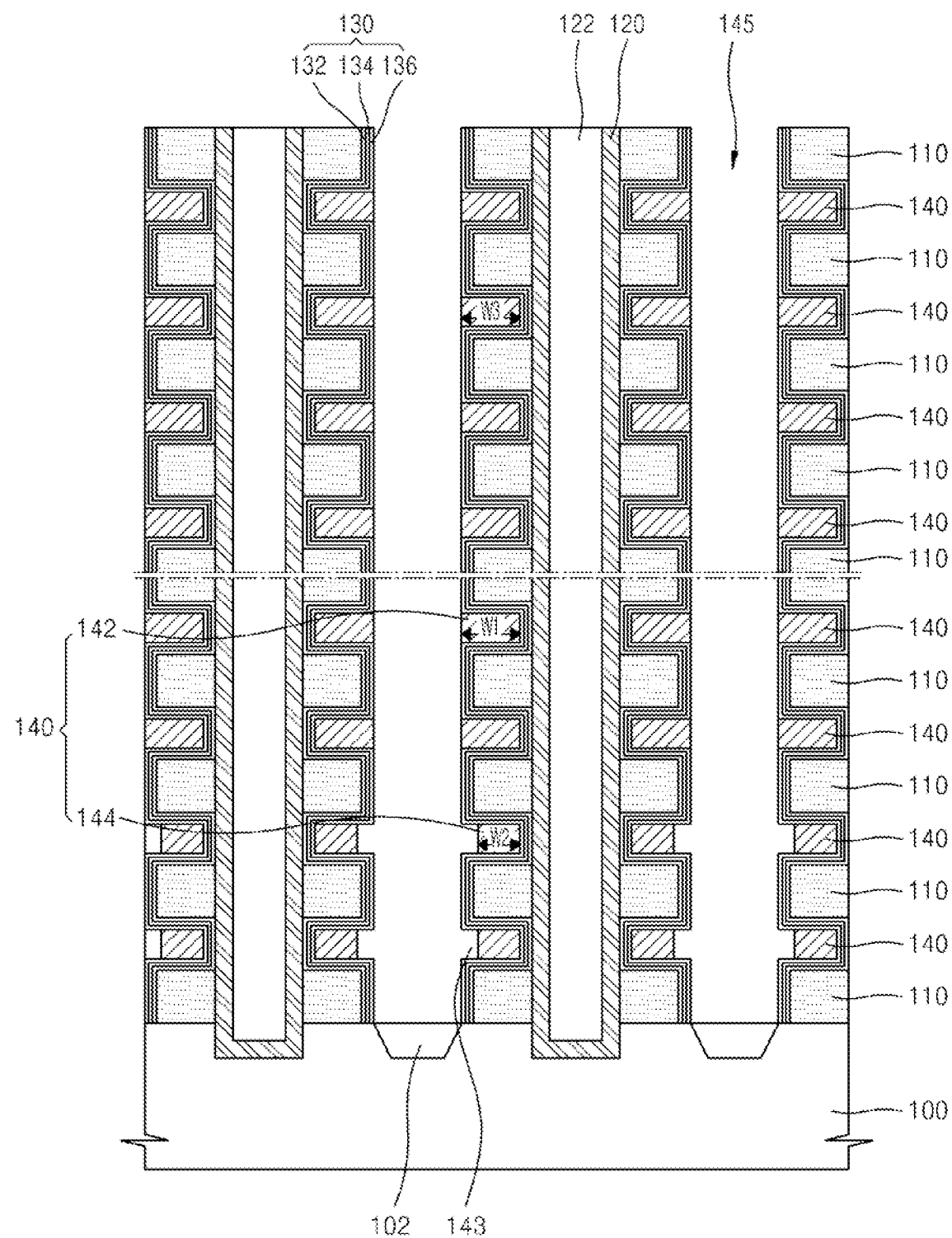

Referring to FIG. 16, the sidewalls of the interlayer insulation layers 110 and the interlayer conductive layers 140 are exposed by removing the first sacrificial spacer 148. Thus, the widths of the fourth opening portions 145 may be increased. As stated above, because the first sacrificial spacer 148 has an etch selectivity different from those of the interlayer insulation layers 110 and the interlayer conductive layers 140, removal of the interlayer insulation layers 110 and the interlayer conductive layers 140 may be minimized while the first sacrificial spacer 148 is removed.

Figure 17:
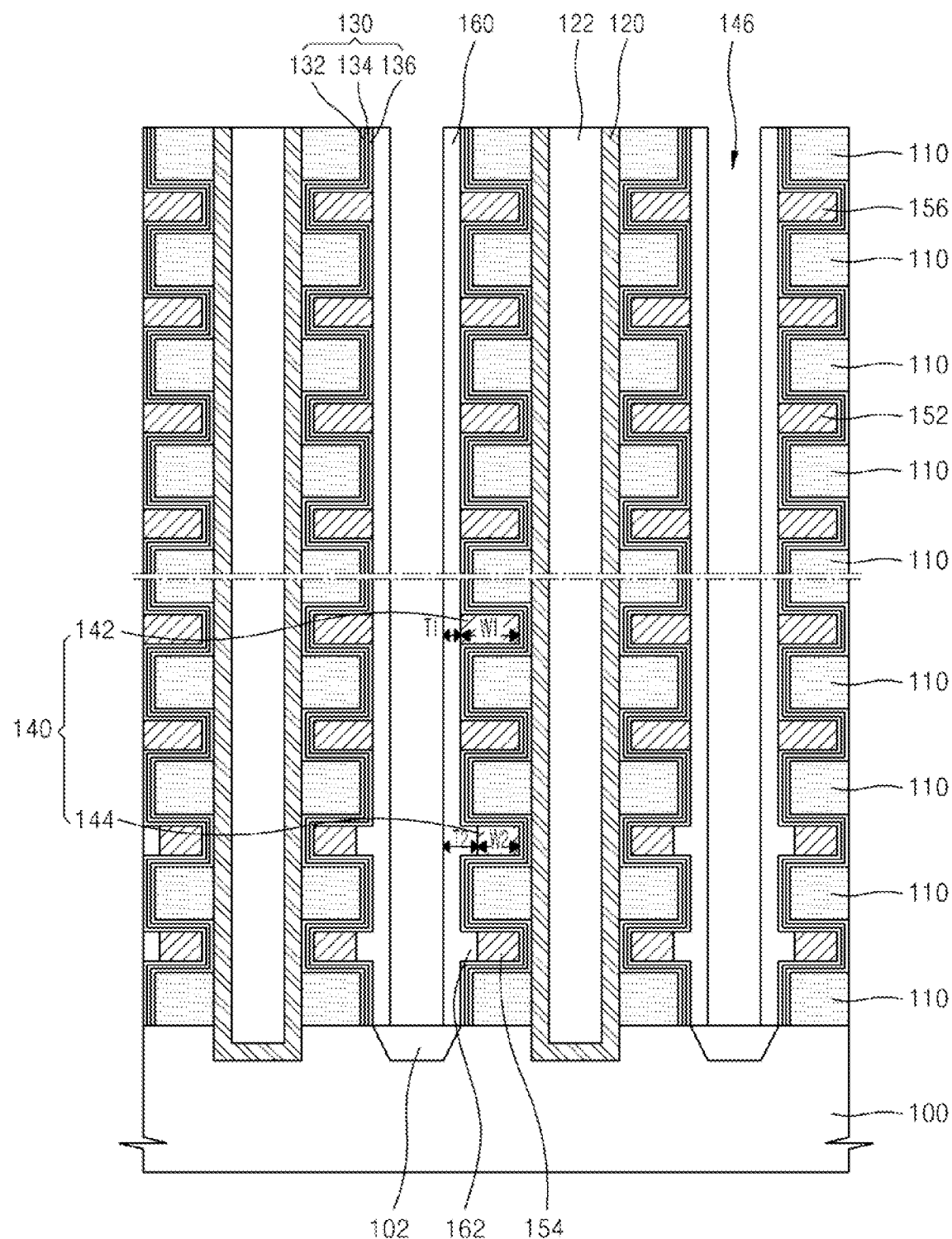

For example, referring to FIG. 17, sidewall insulation layers 160 are formed in the fourth opening portions 145. That is, the sidewall insulation layers 160 are formed on the sidewalls of the interlayer insulation layers 110 and the sidewalls of the interlayer conductive layers 140. In addition, fifth opening portions 146 exposing the impurity region 102 are formed inside the sidewall insulation layers 160. The sidewall insulation layers 160 may be formed by using, for example, a method providing high step coverage. For example, the sidewall insulation layers 160 may be formed by using CVD, ALD, sputtering, electroplating or non-electroplating. As another example, after forming an insulation layer filling the fourth opening portions 145, the sidewall insulation layer 160 including the fifth opening portions 146, which expose the impurity region 102 of the semiconductor layer 100, may be formed by, for example removing a portion of the insulation layer. The sidewall insulation layer 160 may have, for example, a protrusion region 162 protruded toward the second interlayer conductive layer 144 located relatively close to the semiconductor layer 100. The sidewall insulation layer 160 may have, for example, a first thickness T1 on the sidewalls of the first interlayer conductive layer 142 located relatively far from the semiconductor layer 100, and may have a second thickness T2 on the sidewalls of the second interlayer conductive layer 144 located relatively close to the semiconductor layer 100. The second thickness T2 may be, for example, thicker compared to the first thickness T1. A thickness of the sidewall insulation layer 160 on the interlayer insulation layers 110 may be, for example, the same as the first thickness T1. Subsequently, a conductive layer is filled in the fifth opening portions 146, and thus the structure illustrated in FIG. 3 is formed. The conductive layer may become the common source line 170 of FIG. 3. The first interlayer conductive layer 142 constitutes a first control gate electrode 152 and a third control gate electrode 156, and the second interlayer conductive layer 144 constitutes a second control gate electrode 154.

FIGS. 18 through 22 are cross-sectional views illustrating non-volatile memory devices 2, 3, 4, 5, and 6 according to an exemplary embodiment of the inventive concept. The embodiments illustrated in FIGS. 18 through 22 show cases where structures of gate electrodes and a sidewall insulation layer are different from those of the gate electrodes and the sidewall insulation layer illustrated in FIG. 3. Thus, a description of operations or characteristics of elements that are the same as those of FIG. 3 will not be provided here.

Figure 18:
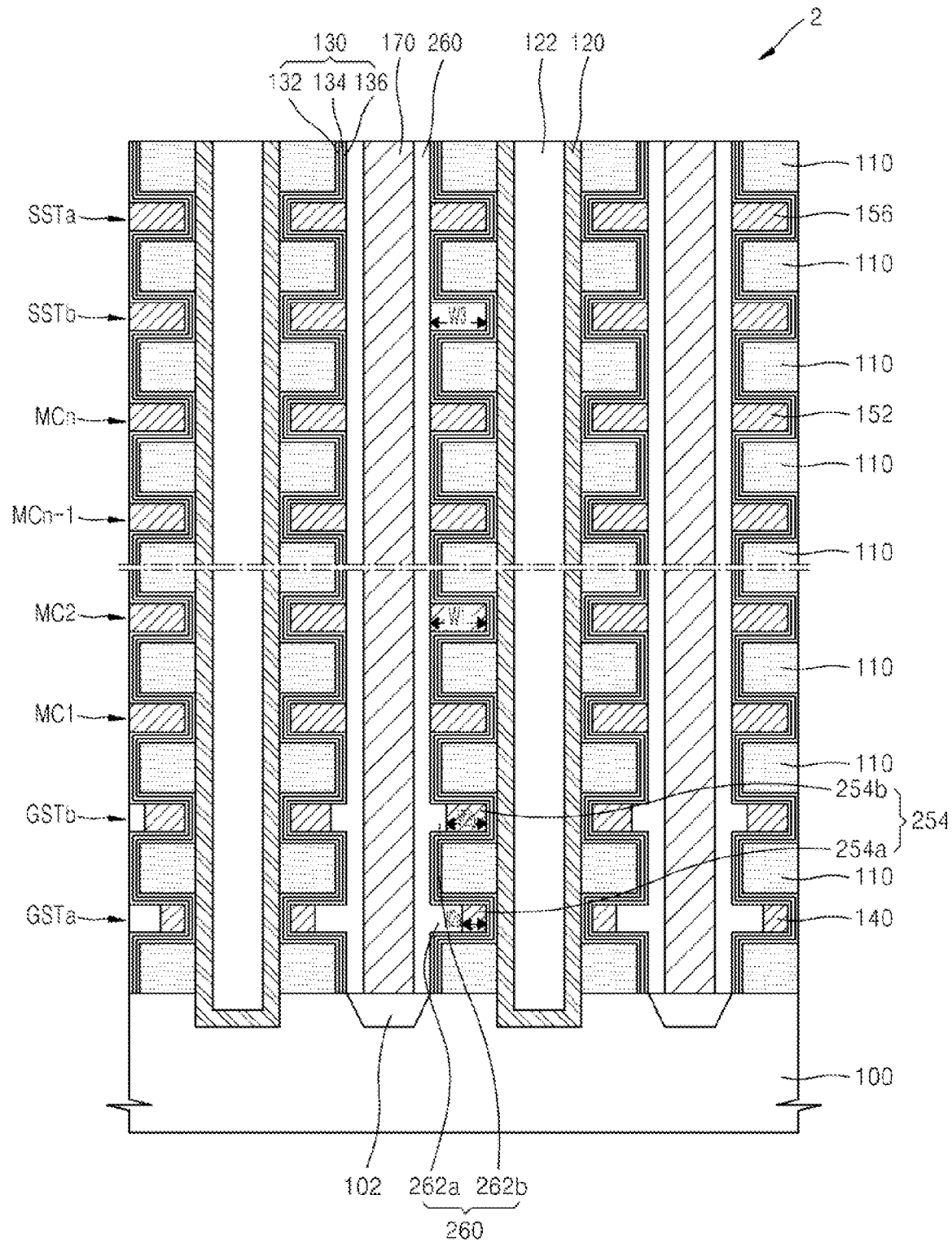
FIGS. 18 through 24 are cross-sectional views illustrating non-volatile memory devices according to an exemplary embodiment of the inventive concept.

Referring to FIG. 18, the non-volatile memory device 2 is illustrated. The non-volatile memory device 2 includes, for example, first control gate electrodes 152 having a first width W1. In addition, the non-volatile memory device 2 may include, for example, second control gate electrodes 254 having widths that are narrower compared to the first width W1 and that are different from each other. The second control gate electrodes 254 may include, for example, lower second control gate electrodes 254a located relatively close to the semiconductor layer 100 and upper second control gate electrodes 254b located relatively far from the semiconductor layer 100. For example, the lower second control gate electrodes 254a may have a lower second width W2a, the upper second control gate electrodes 254b may have an upper second width W2b, and the lower second width W2a may be narrower compared to the upper second width W2b. For example, a sidewall insulation layer 260 may have a lower protrusion region 262a adjacent to the lower second control gate electrodes 254a, and may have an upper protrusion region 262b adjacent to the upper second control gate electrodes 254b, and the upper protrusion region 262b may be narrower compared to the lower protrusion region 262a.

Figure 19:
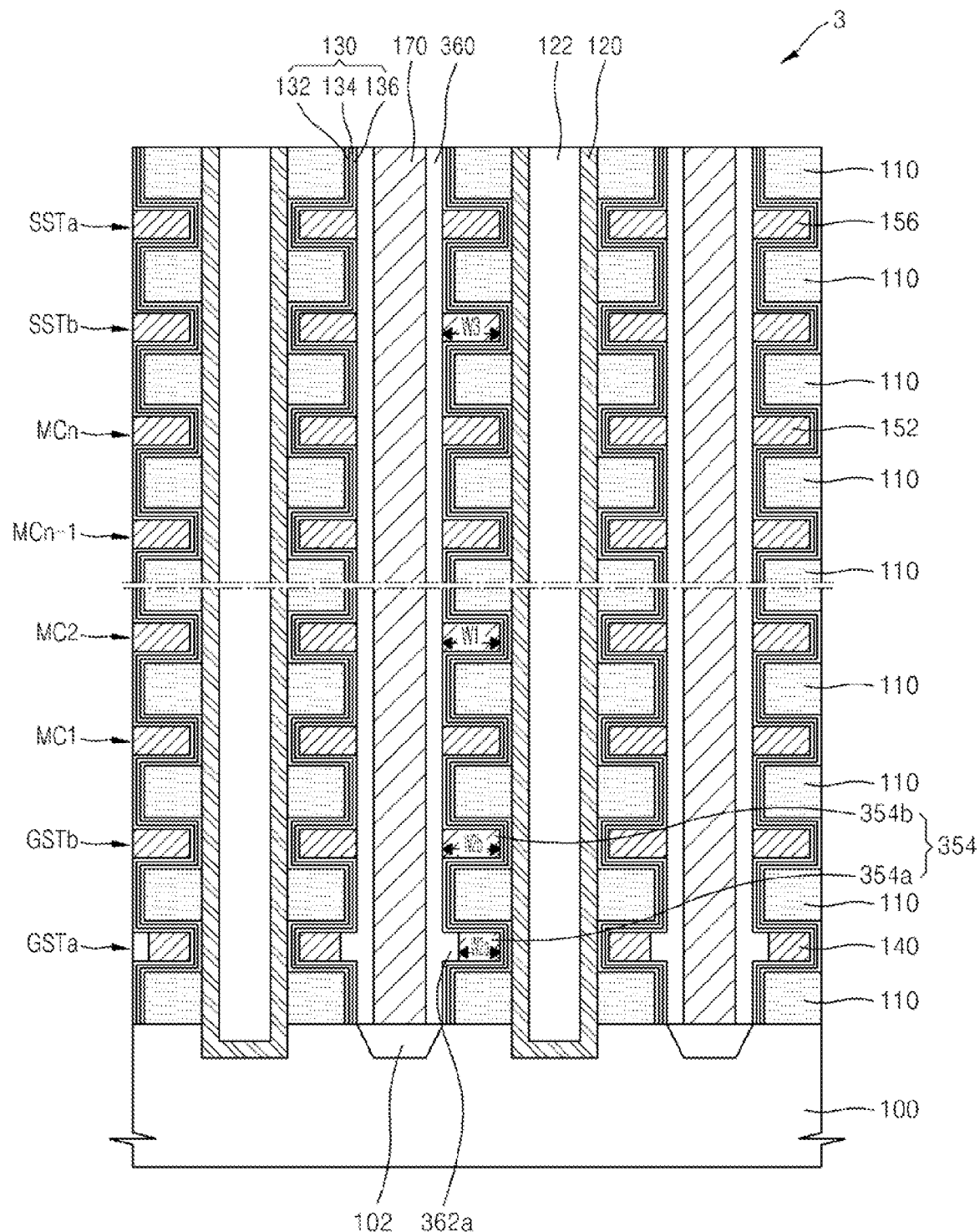

Referring to FIG. 19, the non-volatile memory device 3 is illustrated. The non-volatile memory device 3 may include, for example, first control gate electrodes 152 having a first width W1 and second control gate electrodes 354 having widths different from each other. For example, a lower second width W2a of lower second control gate electrodes 354a may be narrower compared to an upper second width W2b of upper second control gate electrodes 354b, and the upper second width W2b may be the same as the first width W1. For example, a sidewall insulation layer 360 may have a lower protrusion region 362a adjacent to the lower second control gate electrodes 354a, and may not have a protrusion region adjacent to the upper second control gate electrodes 354b. Thus, the upper second control gate electrodes 354b may have the same structure as that of the first control gate electrodes 152.

Figure 20:
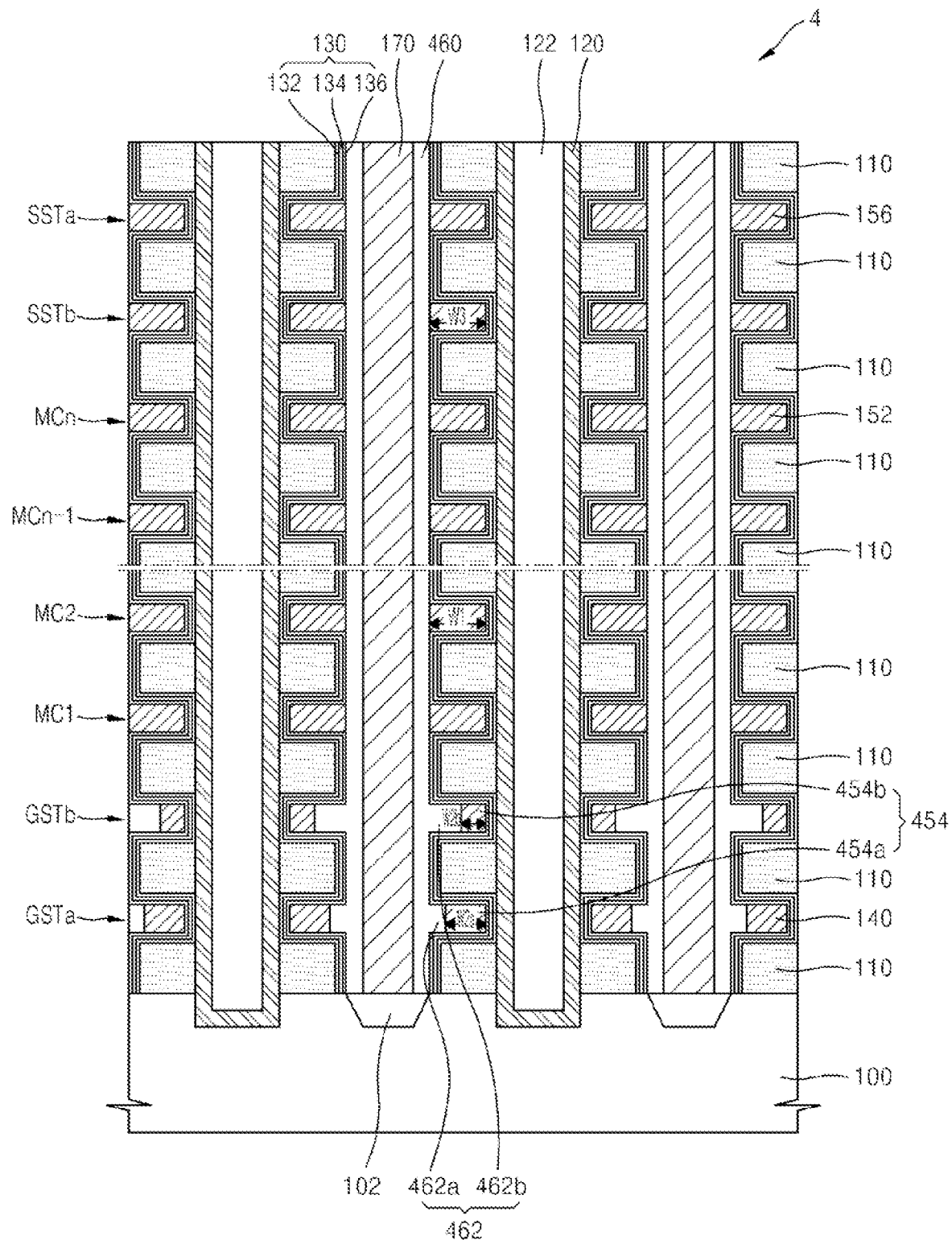

Referring to FIG. 20, the non-volatile memory device 4 is illustrated. The non-volatile memory device 4 includes, for example, first control gate electrodes 152 having a first width W1. In addition, the non-volatile memory device 4 may include, for example, second control gate electrodes 454 having widths that are narrower compared to the first width W1 and that are different from each other. For example, a lower second width W2a of lower second control gate electrodes 454a may be wider compared to an upper second width W2b of upper second control gate electrodes 454b. For example, a sidewall insulation layer 460 may have a lower protrusion region 462a adjacent to the lower second control gate electrodes 454a, and may have an upper protrusion region 462b adjacent to the upper second control gate electrodes 454b. The upper protrusion region 462b may be thicker compared to the lower protrusion region 462a.

Figure 21:
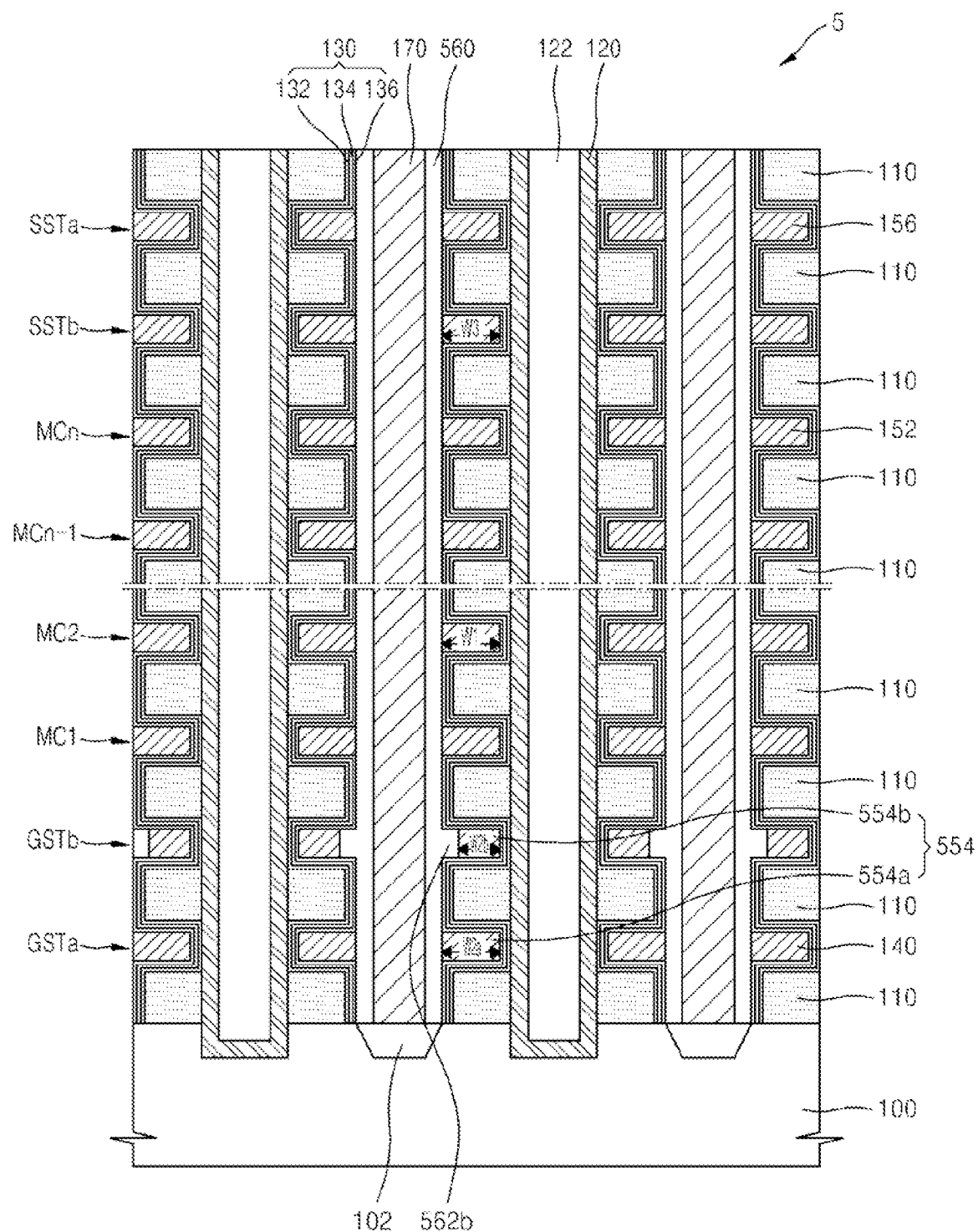

Referring to FIG. 21, the non-volatile memory device 5 is illustrated. The non-volatile memory device 5 may include, for example, first control gate electrodes 152 having a first width W1 and second control gate electrodes 554 having widths different from each other. A lower second width W2a of lower second control gate electrodes 554a may be, for example, wider compared to an upper second width W2b of upper second control gate electrodes 554b, and the lower second width W2a may be, for example, the same as the first width W1. For example, a sidewall insulation layer 560 may have an upper protrusion region 562b adjacent to the upper second control gate electrodes 554b, and may not have a protrusion region adjacent to the lower second control gate electrodes 554a. Thus, the lower second control gate electrodes 554a may have the same structure as that of the first control gate electrodes 152.

Figure 22:
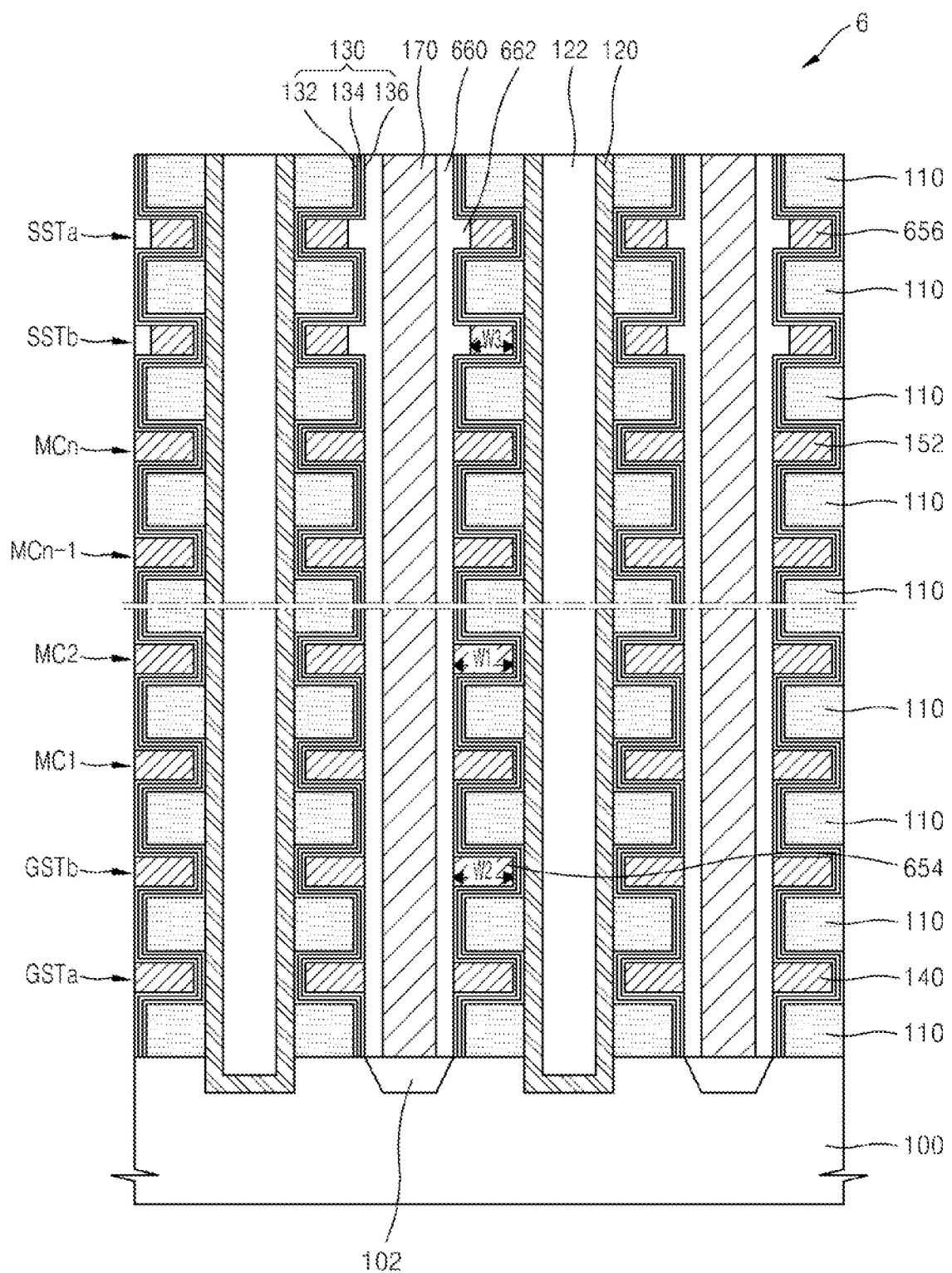

The embodiment illustrated in FIG. 22 is a case where one of the changes to a structure of ground selection transistors already described above is applied to a structure of string selection transistors. Referring to FIG. 22, the non-volatile memory device 6 is illustrated. For example, the non-volatile memory device 6 may include first control gate electrodes 152 having a first width W1 and second control gate electrodes 654 having a second width W2 equal to the first width W1. In addition, for example, the non-volatile memory device 6 may include third control gate electrodes 656 having a third width W3 that is narrower compared to the first width W1, between a sidewall insulation layer 660 and a channel region 120. The third control gate electrodes 656 may be located far from the semiconductor layer 100 compared to the first control gate electrodes 152. Technical characteristics of the devices explained with reference to FIGS. 18 through 21 may be combined with the present embodiment of FIG. 22. For example, various changes to the second width W2 of the second gate electrodes 654 may instead be applied to the third width W3 of the third control gate electrodes 656. In addition, the second width W2 of the second gate electrodes 654 and the third width W3 of the third control gate electrodes 656 may be changed together. In addition, the sidewall insulation layers 660 may have one or more protrusion regions 662 protruded toward the third control gate electrodes 656 in a region in which the third control gate electrodes 656 are located.

Figure 23:
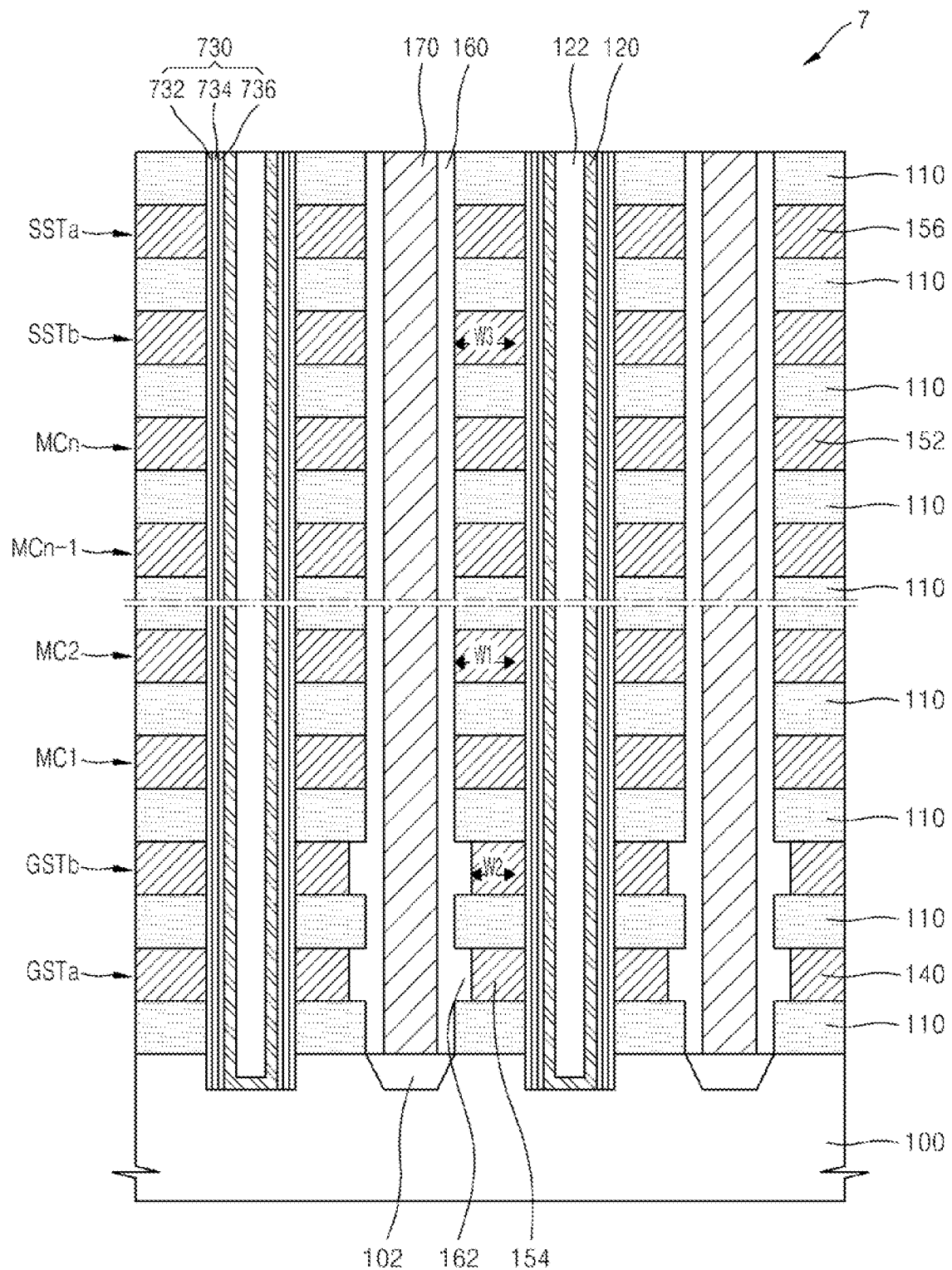

FIG. 23 is a cross-sectional view illustrating a non-volatile memory device 7 according to an exemplary embodiment of the inventive concept. The embodiment illustrated in FIG. 23 is a case where a structure of a storage structure is different from that of the storage structure 130 illustrated in FIG. 3. Thus, a description of the operations or characteristics of elements that are the same as those of FIG. 3 will not be provided here.

Referring to FIG. 23, the non-volatile memory device 7 is illustrated. The non-volatile memory device 7 includes, for example, a storage structure 730 extending continuously along channel regions 120. For example, a tunneling insulation layer 732, a charge storage layer 734, and a blocking insulation layer 736 that constitute the storage structure 730 extend continuously along the channel regions 120. Accordingly, the storage structure 730 may have, for example, a straight line shape. First and second control gate electrodes 152 and 154 of FIG. 23 are similar to the first and second control gate electrodes 152 and 154 of FIG. 3. For example, the first control gate electrodes 152 may have a first width W1 between a sidewall insulation layer 160 and the channel regions 120, and the second control gate electrodes 154 may have a second width W2 that is narrower compared to the first width W1, between the sidewall insulation layer 160 and the channel regions 120. In the current embodiment, the third control gate electrodes 156 may have, for example, a third width W3 between the sidewall insulation layer 160 and the channel region 120, and the third width W3 may be the same as the first width W1. In addition, technical characteristics of the devices explained with reference to FIGS. 18 through 22 may be combined with the present embodiment of FIG. 23.

Figure 24:
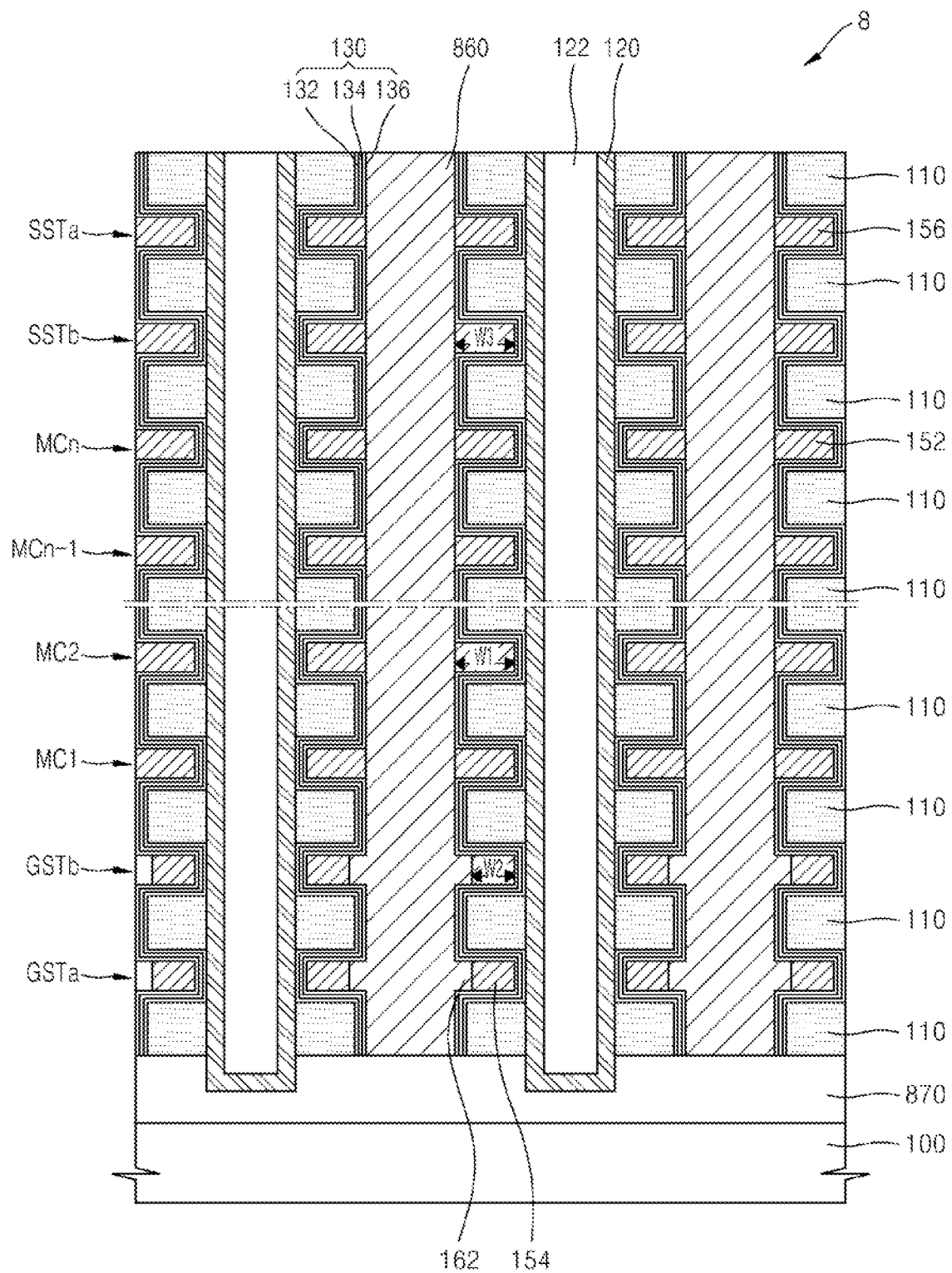

FIG. 24 is a cross-sectional view illustrating a non-volatile memory device 8 according to an exemplary embodiment of the inventive concept. The embodiment illustrated in FIG. 24 is a case where a structure of a common source line is different from that of the common source line 170 illustrated in FIG. 3. Thus, a description of operations or characteristics of elements that are the same as those of FIG. 3 will not be provided here.

Referring to FIG. 24, the non-volatile memory device 8 is illustrated. The non-volatile memory device 8 includes, for example, a common source line 870 located on a semiconductor layer 100. The common source line 870 may be, for example, a common source region and may correspond to the impurity region 102 of FIG. 3. That is, instead of the common source line 170 of FIG. 3 extending in a vertical direction, the common source line 870 extends, for example, in a horizontal direction on the semiconductor layer 100. Accordingly, a sidewall insulation layer 860 does not include a common source line therein, and fills spaces between first through the third control gate electrodes 152, 154, and 156. The first and second control gate electrodes 152 and 154 of FIG. 24 are similar to the first and second control gate electrodes 152 and 154 of FIG. 3. For example, the first control gate electrodes 152 may have a first width W1 between the sidewall insulation layer 860 and channel regions 120, and the second control gate electrodes 154 may have a second width W2 that is narrower compared to the first width W1, between the sidewall insulation layer 860 and the channel regions 120. In the current embodiment, the third control gate electrodes 156 may have, for example, a third width W3 between the sidewall insulation layer 860 and the channel region 120, and the third width W3 may be the same as the first width W1. Also, the sidewall insulation layer 860 may have, for example, one or more protrusion regions 162 protruded toward the second control gate electrodes 154 in a region where the second control gate electrodes 154 are located. In addition, technical characteristics of the devices explained with reference to FIGS. 18 through 23 may be combined with the present embodiment of FIG. 24.

Figure 25:
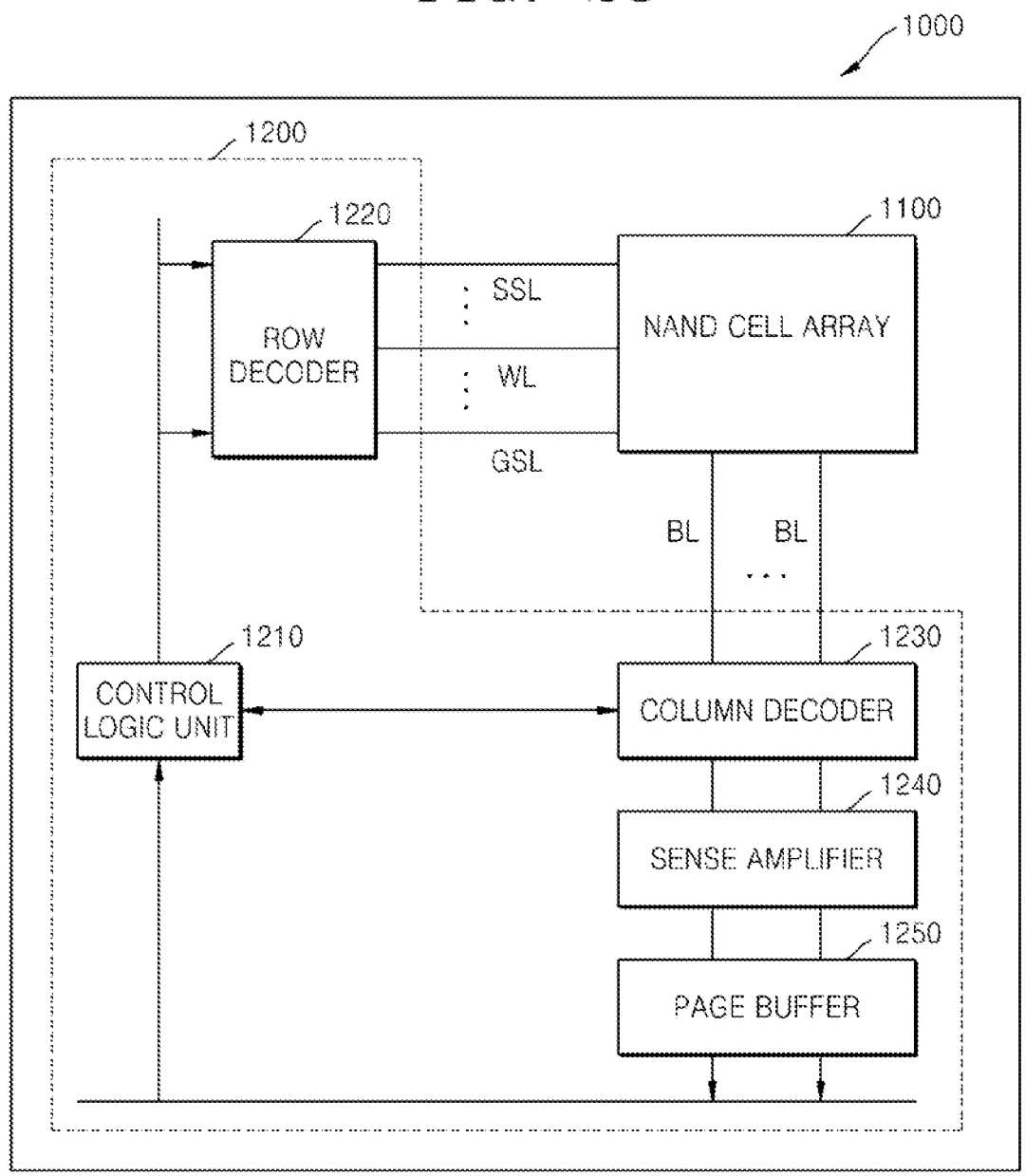
FIG. 25 is a schematic block diagram illustrating a non-volatile memory device having a vertical structure according to an exemplary embodiment of the inventive concept.

FIG. 25 is a schematic block diagram illustrating a non-volatile memory device 1000 having a vertical structure according to an exemplary embodiment of the inventive concept.

Referring to FIG. 25, a NAND cell array 1100 may be combined with a core circuit unit 1200. For example, the NAND cell array 1100 may include a non-volatile memory cells having a vertical structure. The core circuit unit 1200 may include, for example, a control logic unit 1210, a row decoder 1220, a column decoder 1230, a sense amplifier 1240, and a page buffer 1250.

The control logic unit 1210 may communicate with the row decoder 1220, the column decoder 1230, and the page buffer 1250. The row decoder 1220 may communicate with the NAND cell array 1100 having a stacked structure, through, for example, string selection lines SSL, word lines WL, and ground selection lines GSL. The column decoder 1230 may communicate with the NAND cell array 1100 through, for example, bit lines BL. For example, the sense amplifier 1240 may be connected to the column decoder 1230 when a signal is output from the NAND cell array 1100, and may not be connected to the column decoder 1230 when a signal is transmitted to the NAND cell array 1100.

For example, the control logic unit 1210 may transmit a row address signal to the row decoder 1220, and the row decoder 1220 may decode the row address signal and then transmit a decoded row address signal to the NAND cell array 1100 through the string selection lines SSL, the word lines WL, and the ground selection lines GSL. The control logic unit 1210 may transmit, for example, a column address signal to the column decoder 1230 or the page buffer 1250, and the column decoder 1230 may decode the column address signal and then transmit, for example, a decoded column address signal to the NAND cell array 1100 through the bit lines BL. An output signal of the NAND cell array 1100 may be transmitted to, for example, the sense amplifier 1240 through the column decoder 1230, and may be amplified, for example, in the sense amplifier 1240. An amplified output signal may be transmitted to, for example, the control logic unit 1210 through the page buffer 1250.

Figure 26:
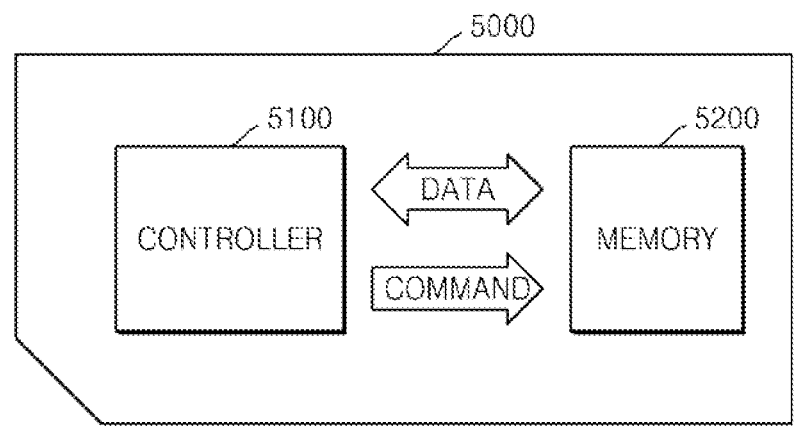
FIG. 26 is a schematic view illustrating a memory card according to an exemplary embodiment of the inventive concept.

FIG. 26 is a schematic view illustrating a memory card 5000 according to an exemplary embodiment of the inventive concept.

For example, referring to FIG. 26, a controller 5100 and a memory 5200 are disposed to send/receive electric signals to/from each other. For example, when the controller 5100 gives a command to the memory 5200, the memory 5200 may send data. The memory 5200 may include a non-volatile memory device according to an exemplary embodiment of the inventive concept. The non-volatile memory devices according to exemplary embodiments of the inventive concept may be disposed in, for example, NAND or NOR architecture arrays in correspondence to a logic gate design. Such NAND and NOR arrays are generally known in the art. The memory arrays may be disposed in a plurality of rows and columns and may have one or more memory array banks (not shown). The memory 5200 may include the memory arrays (not shown) or the memory array banks (not shown), all of which are known in the art. The memory card 5000 may further include conventional members, such as, for example, a row decoder (not shown), a column decoder (not shown), input/output (I/O) buffers (now shown), and/or a control resistor (not shown), to drive the memory array banks (not shown), all of which are known in the art. The memory card 5000 may be used in memory devices as a memory card, such as, for example, a memory stick card, a smart media (SM) card, a secure digital (SD) card, a mini SD card, or a multi media card (MMC).

Figure 27:
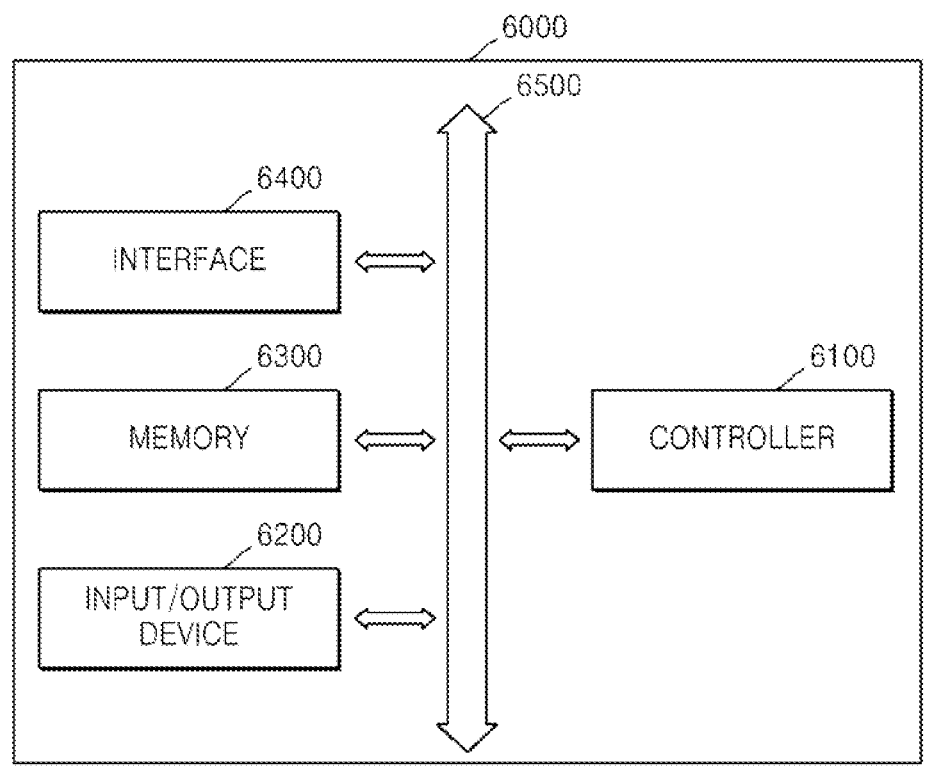
FIG. 27 is a schematic block diagram of a system including a non-volatile memory device according to an exemplary embodiment of the inventive concept.

FIG. 27 is a schematic block diagram of a system 6000 including a non-volatile memory device according to an exemplary embodiment of the inventive concept.

For example, referring to FIG. 27, the system 6000 may include a controller 6100, an input/output device 6200, a memory 6300, and an interface 6400. The system 6000 may be a mobile system or a system that transmits or receives data. The mobile system may be, for example, a personal digital assistant (PDA), a portable computer, a web tablet, a wireless phone, a mobile phone, a digital music player, or a memory card. The controller 6100 executes a software program and controls the system 6000. The controller 6100 may be, for example, a microprocessor, a digital signal processor, a microcontroller, or the like. The input/output device 6300 may be used to input or output data of the system 6000. The system 6000 is connected to an external apparatus, such as for example, a personal computer or a network, using the input/output device 6200, to send/receive data to/from the external apparatus. The input/output device 6200 may be, for example, a keypad, a keyboard, or a display. The memory 6300 may store codes and/or data for operating the controller 6100 and/or may store data processed by the controller 6100. The memory 6300 may include a non-volatile memory device according to an exemplary embodiment of the inventive concept. The interface 6400 may be a data transmission path between the system 6000 and an external apparatus. The controller 6100, the input/output device 6200, the memory 6300, and the interface 6400 may communicate with one another by, for example, a bus 6500. For example, the system 6000 may be used for a mobile phone, an MP3 player, a navigation system, a portable multimedia player (PMP), a solid state disk (SSD), or a household appliance.

Having described exemplary embodiments of the inventive concept, it is further noted that it is readily apparent to those of reasonable skill in the art that various modifications may be made without departing from the spirit and scope of the invention which is defined by the metes and bounds of the appended claims.

What is claimed is:

1. A non-volatile memory device having a vertical structure, the non-volatile memory device comprising:
   a semiconductor layer;
   a sidewall insulation layer extending in a vertical direction on the semiconductor layer, and having one or more protrusion regions;
   a plurality of first control gate electrodes arranged in the vertical direction on the semiconductor layer; and
   a plurality of second control gate electrodes arranged in the vertical direction on the semiconductor layer, and respectively contacting one of the one or more protrusion regions,
   wherein widths of the second control gate electrodes are narrower than widths of the first control gate electrodes.

2. The non-volatile memory device of claim 1, wherein the plurality of first control gate electrodes respectively contact one or more portions of the sidewall insulation layer where the one or more protrusion regions are not formed.

3. The non-volatile memory device of claim 1, wherein widths of the second control gate electrodes are the same as each other.

4. The non-volatile memory device of claim 1, wherein widths of the second control gate electrodes are different from each other.

5. The non-volatile memory device of claim 1, wherein a width of at least one second control gate electrode located relatively close to the semiconductor layer is narrower than a width of at least one second control gate electrode located relatively far from the semiconductor layer.

6. The non-volatile memory device of claim 1, wherein a width of at least one second control gate electrode located relatively close to the semiconductor layer is wider than a width of at least one second control gate electrode located relatively far from the semiconductor layer.

7. The non-volatile memory device of claim 1, wherein the second control gate electrodes are located relatively close to the semiconductor layer, compared to the first control gate electrodes.

8. The non-volatile memory device of claim 1, wherein the second control gate electrodes are located relatively far from the semiconductor layer, compared to the first control gate electrodes.

9. The non-volatile memory device of claim 1, wherein the sidewall insulation layer includes a plurality of protrusion regions and wherein widths of the protrusion regions are the same as each other.

10. The non-volatile memory device of claim 1, wherein the sidewall insulation layer includes a plurality of protrusion regions and wherein widths of the protrusion regions are different from each other.

11. The non-volatile memory device of claim 1, wherein the second control gate electrodes constitute one of ground selection transistors or string selection transistors.

12. The non-volatile memory device of claim 1, wherein the first control gate electrodes adjacent to the second control gate electrodes constitute one of ground selection transistors or string selection transistors.

13. The non-volatile memory device of claim 1, wherein the first control gate electrodes constitute memory cells.

14. A non-volatile memory device having a vertical structure, the non-volatile memory device comprising:
    a semiconductor layer;
    a channel region extending in a vertical direction on the semiconductor layer;
    a plurality of control gate electrodes arranged along a sidewall of the channel region in the vertical direction on the semiconductor layer; and
    a sidewall insulation layer located opposite to the channel region with respect to the plurality of control gate electrodes, and having one or more protrusion regions protruded toward some of the control gate electrodes of the plurality of control gate electrodes, and wherein one or more of the plurality of control gate electrodes respectively contact a portion of the sidewall insulation layer where the one or more protrusion regions are not formed.

15. The non-volatile memory device of claim 14, further comprising a storage structure interposed between the channel region and the control gate electrodes, wherein the storage structure continuously extends along the control gate electrodes.

16. The non-volatile memory device of claim 14, further comprising a storage structure interposed between the channel region and the control gate electrodes, wherein the storage structure continuously extends along the channel region.

17. The non-volatile memory device of claim 14, further comprising a common source line disposed in the vertical direction on a portion of the semiconductor layer and contacting the sidewall insulation layer.

18. The non-volatile memory device of claim 14, further comprising a common source line disposed in a horizontal direction on the semiconductor layer and underneath the plurality of control gate electrodes.

19. The non-volatile memory device of claim 18, wherein the channel region extends into a recessed portion of the common source line.

* * * * *